US008830755B1

(12) United States Patent
Dong et al.

(10) Patent No.: US 8,830,755 B1
(45) Date of Patent: *Sep. 9, 2014

(54) REDUCING WEAK-ERASE TYPE READ DISTURB IN 3D NON-VOLATILE MEMORY

(71) Applicant: SanDisk Technologies Inc., Plano, TX (US)

(72) Inventors: Yingda Dong, San Jose, CA (US); Man L Mui, Santa Clara, CA (US); Hitoshi Miwa, Kanagawa (JP)

(73) Assignee: SanDisk Technologies Inc., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/277,311

(22) Filed: May 14, 2014

Related U.S. Application Data

(63) Continuation of application No. 14/071,288, filed on Nov. 4, 2013, which is a continuation of application No. 13/364,518, filed on Feb. 2, 2012, now Pat. No. 8,670,285.

(51) Int. Cl.
G11C 16/10 (2006.01)
G11C 16/26 (2006.01)

(52) U.S. Cl.
CPC .................................... G11C 16/26 (2013.01)
USPC ................................................... 365/185.18

(58) Field of Classification Search
CPC ..................................................... G11C 16/10
USPC ................................................... 365/185.18
See application file for complete search history.

(56) References Cited

U.S. PATENT DOCUMENTS

| 6,707,714 | B2 | 3/2004 | Kawamura |
| 7,440,318 | B2 | 10/2008 | Fong et al. |
| 7,505,322 | B2 | 3/2009 | Lee |
| 7,515,463 | B2 | 4/2009 | Hemink |
| 7,623,385 | B2 * | 11/2009 | Kim et al. ............... 365/185.17 |
| 8,670,285 | B2 | 3/2014 | Dong et al. |
| 2009/0268524 | A1 | 10/2009 | Maejima |

(Continued)

OTHER PUBLICATIONS

International Search Report & The Written Opinion of the International Searching Authority dated Mar. 26, 2013, International Application No. PCT/US2012/066460.

(Continued)

*Primary Examiner* — Hoai V Ho
*Assistant Examiner* — Min Huang
(74) *Attorney, Agent, or Firm* — Vierra Magen Marcus LLP

(57) ABSTRACT

A read process for a 3D stacked memory device provides an optimum level of channel boosting for unselected memory strings, to repress both normal and weak-erase types of read disturbs. The channel is boosted by controlling of voltages of bit lines (Vbl), drain-side select gates (Vsgd_unsel), source-side select gates (Vsgs_unsel), a selected level (word line layer) of the memory device (Vcg_sel), and unselected levels of the memory device (Vcg_unsel). A channel can be boosted by initially making the drain-side and source-side select gates non-conductive, to allow capacitive coupling from an increasing Vcg_unsel. The drain-side and/or source-side select gates are then made conductive by raising Vsgd_unsel and/or Vsgs_unsel, interrupting the boosting. Additionally boosting can occur by making the drain-side and/or source-side select gates non-conductive again while Vcg_unsel is still increasing. Or, the channel can be driven at Vbl. Two-step boosting drives the channel at Vbl, then provides boosting by capacitive coupling.

28 Claims, 28 Drawing Sheets

(56) References Cited

U.S. PATENT DOCUMENTS

2010/0232224 A1    9/2010   Maeda et al.
2011/0019468 A1*   1/2011   Shepard .................. 365/175
2011/0019486 A1    1/2011   Jang et al.
2011/0317489 A1*  12/2011   Kim et al. ............. 365/185.18
2012/0300550 A1*  11/2012   Hemink et al. ......... 365/185.17
2013/0058165 A1*   3/2013   Maejima et al. ....... 365/185.11
2013/0170297 A1*   7/2013   Nam et al. ............. 365/185.09
2014/0056065 A1    2/2014   Dong et al.

OTHER PUBLICATIONS

Notice of Allowance and Fee(s) Due dated Aug. 27, 2013, U.S. Appl. No. 13/364,518, filed Feb. 2, 2012, Jun. 10, 2014.

* cited by examiner

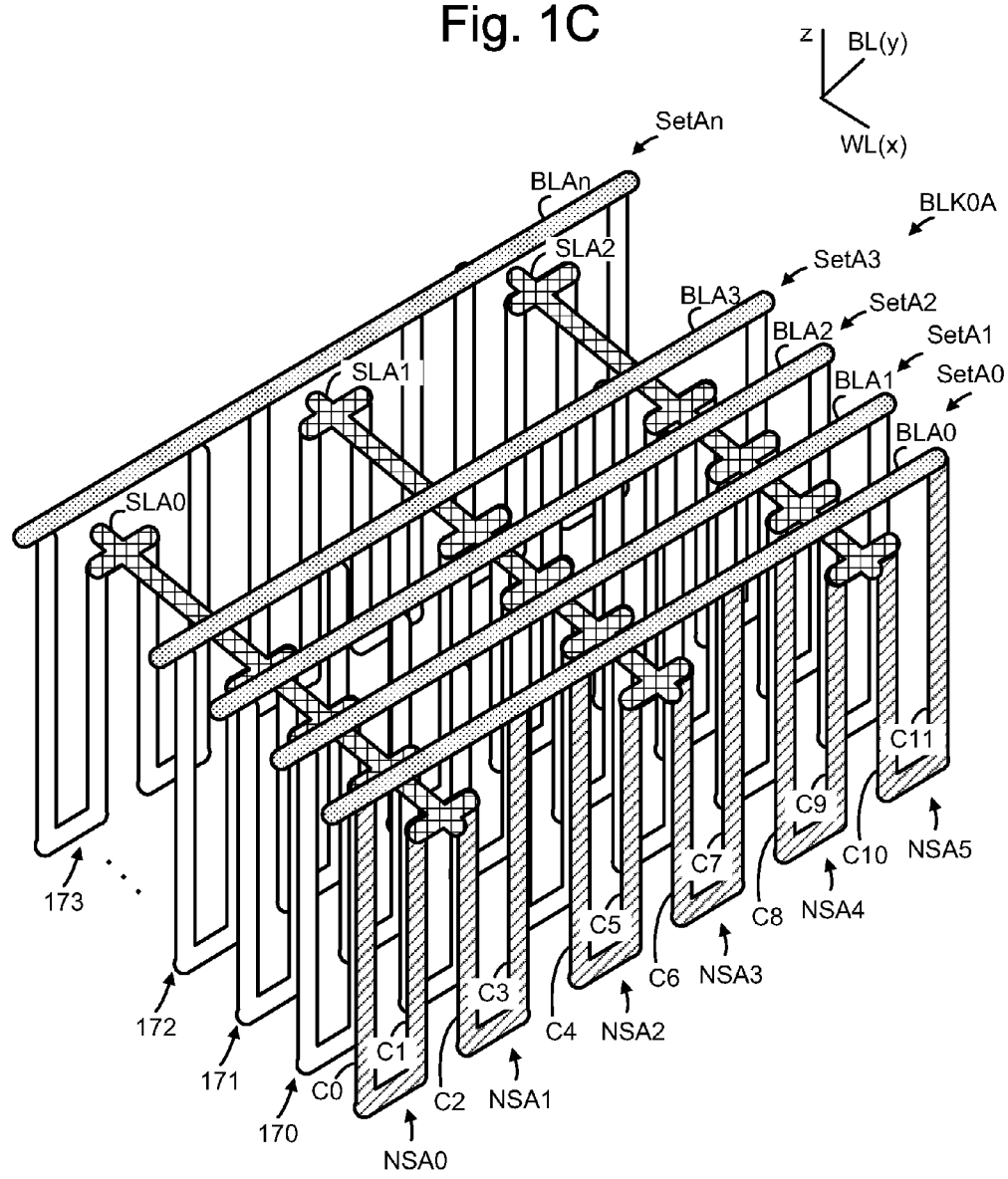

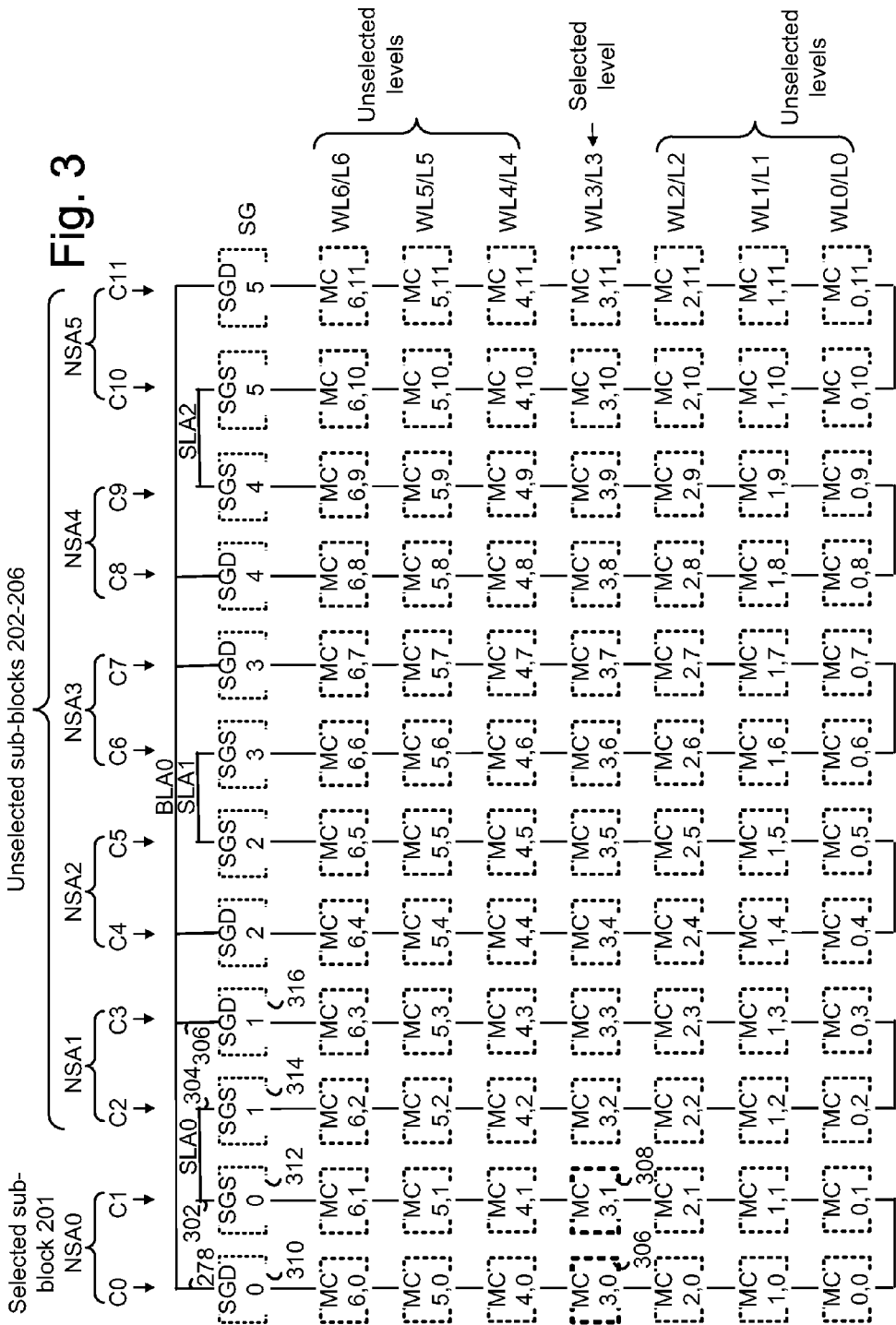

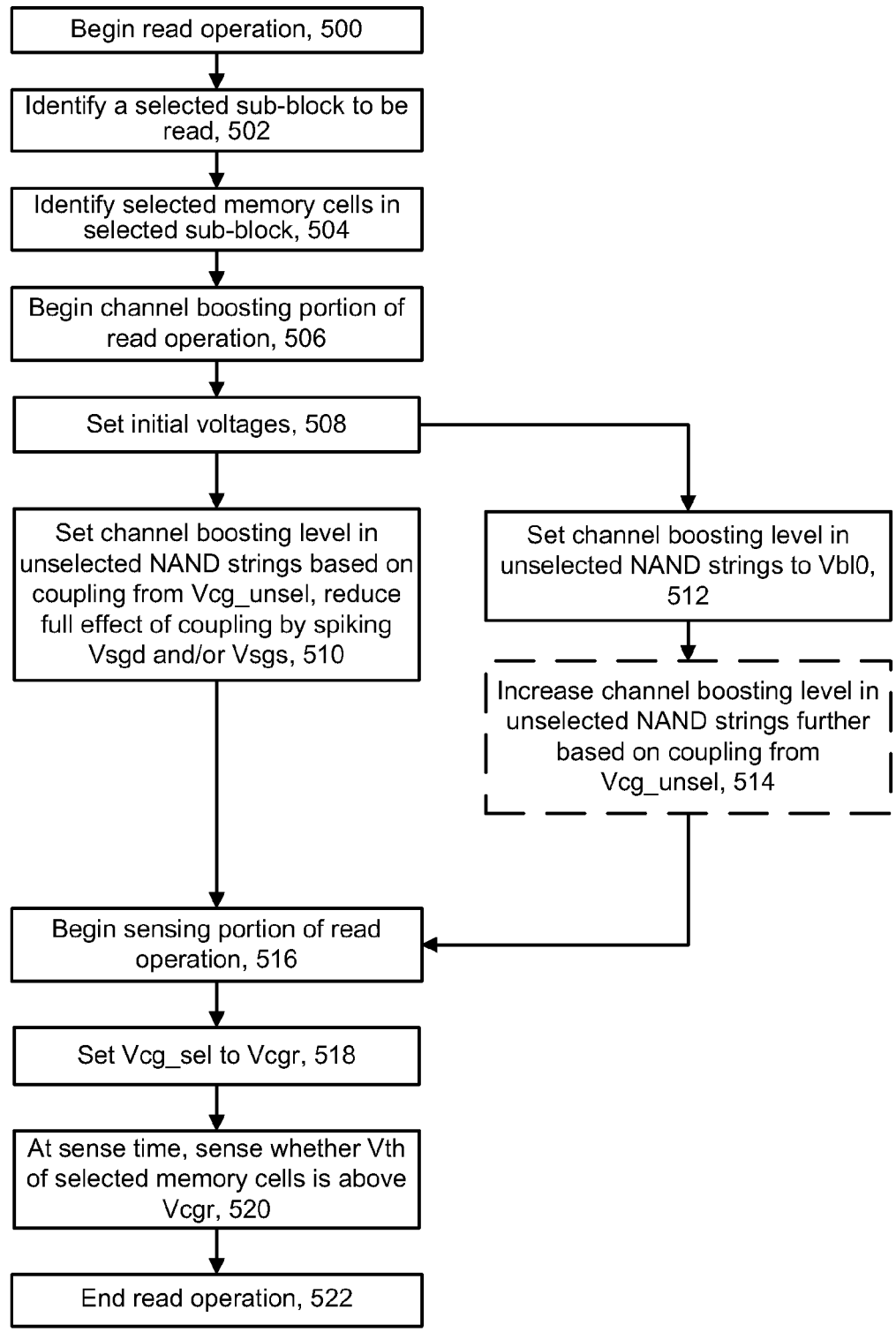

Fig. 5B

```
Vsgd_unsel and
Vsgs_unsel:         0 V    → spike (to V1)   →0 V
Vsgd_sel and Vsgs_sel:  0 V    →V2           →0 V
Vcg_unsel:          0 V    →Vread_pass       →0 V
Vcg_sel:            0 V    →Vread_pass       →0 V  →Vcgr    →0 V
Vbl:                0 V    →Vbl0             →0 V
```

Fig. 5C

```
Vsgd_unsel:         0 V    →spike (to V1)    →0 V
Vsgs_unsel:         0 V
Vsgd_sel and Vsgs_sel:  0 V    →V2           →0 V
Vcg_unsel:          0 V    →Vread_pass       →0 V
Vcg_sel:            0 V    →Vread_pass       →0 V  →Vcgr    →0 V
Vbl:                0 V    →Vbl0             →0 V
```

Fig. 5D

```
Vsgd_unsel:         0 V
Vsgs_unsel:         0 V    →spike (to V1)    →0 V
Vsgd_sel and Vsgs_sel:  0 V    →V2           →0 V
Vcg_unsel:          0 V    →Vread_pass       →0 V
Vcg_sel:            0 V    →Vread_pass       →0 V  →Vcgr    →0 V
Vbl:                0 V    →Vbl0             →0 V
```

Fig. 5E

| | | | |
|---|---|---|---|
| Vsgd_unsel and | | | |
| Vsgs_unsel: | 0 V | →spike (to V1) | →0 V |
| Vsgd_sel and Vsgs_sel: | 0 V | →V2 | →0 V |
| Vcg_unsel: | 0 V | →Vread_pass | →0 V |
| Vcg_sel: | 0 V | →Vcgr | →0 V |
| Vbl: | 0 V | →Vbl0 | →0 V |

Fig. 5F

| | | | | | |
|---|---|---|---|---|---|
| Vsgd_unsel: | 0 V | →V2 | →0 V | | |
| Vsgs_unsel: | 0 V | | | | |
| Vsgd_sel and Vsgs_sel: | 0 V | →V2 | →0 V | | |
| Vcg_unsel: | 0 V | →Vread_pass | →0 V | | |
| Vcg_sel: | 0 V | →Vread_pass | →0 V | →Vcgr | →0 V |
| Vbl: | 0 V | →Vbl0 | →0 V | | |

Fig. 5G

| | | | | | | |
|---|---|---|---|---|---|---|
| Vsgd_unsel: | 0 V | →V2 | →0 V | | | |
| Vsgs_unsel: | 0 V | | | | | |
| Vsgd_sel and Vsgs_sel: | 0 V | →V2 | →0 V | | | |
| Vcg_unsel: | 0 V | →Vread_pass1 | →Vread_pass2 | →0 V | | |
| Vcg_sel: | 0 V | →Vread_pass | →0 V | | →Vcgr | →0 V |
| Vbl: | 0 V | →Vbl0 | →0 V | | | |

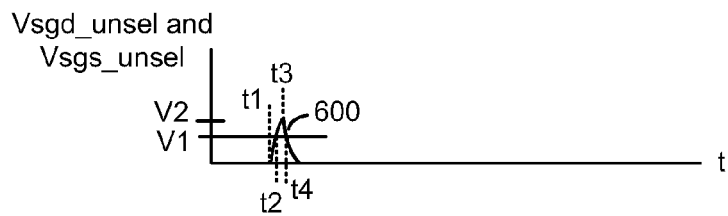
Fig. 6A1
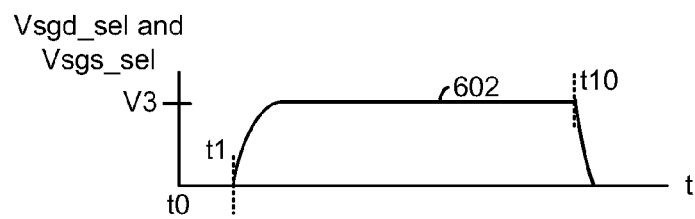
Fig. 6B
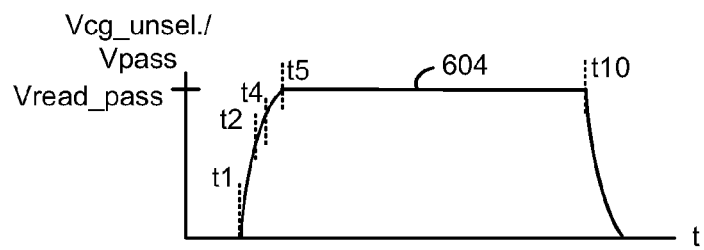
Fig. 6C
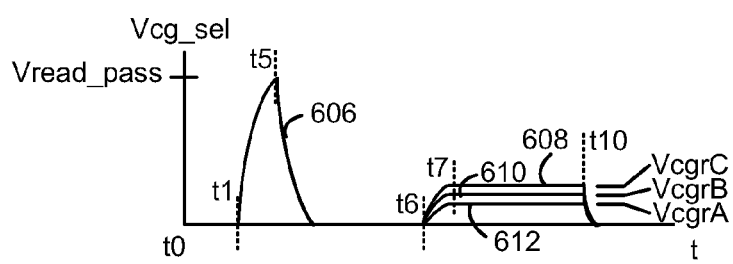
Fig. 6D1
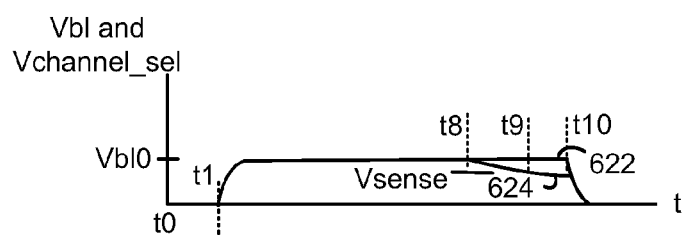
Fig. 6E
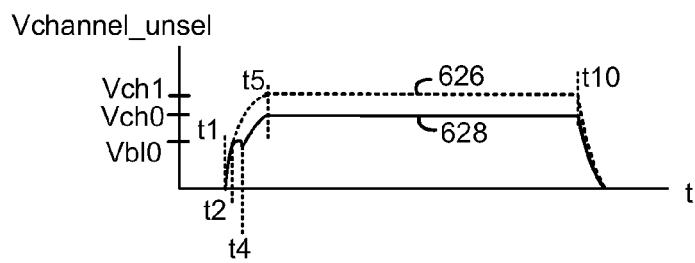
Fig. 6F

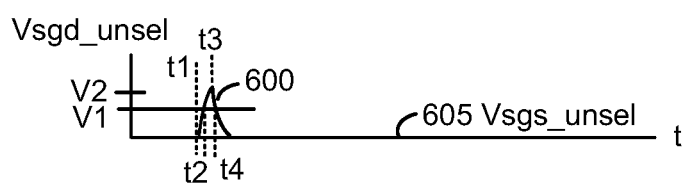
Fig. 6A2
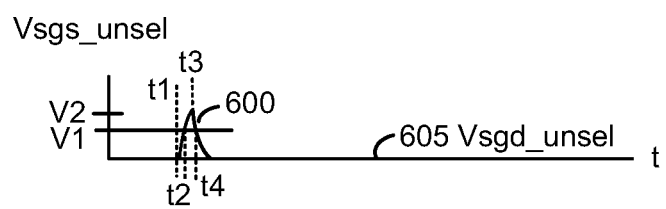
Fig. 6A3
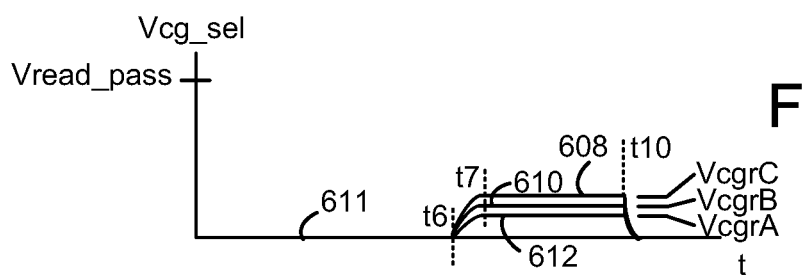
Fig. 6D2

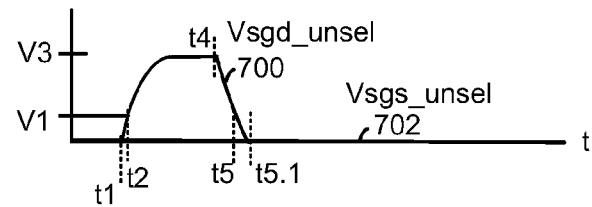
Fig. 7A
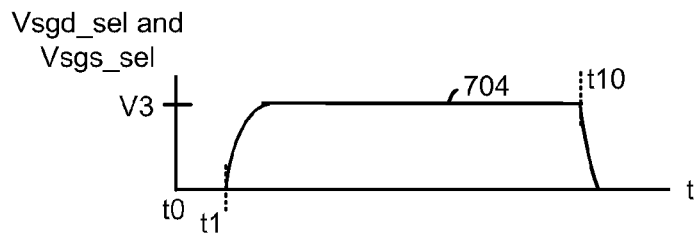
Fig. 7B
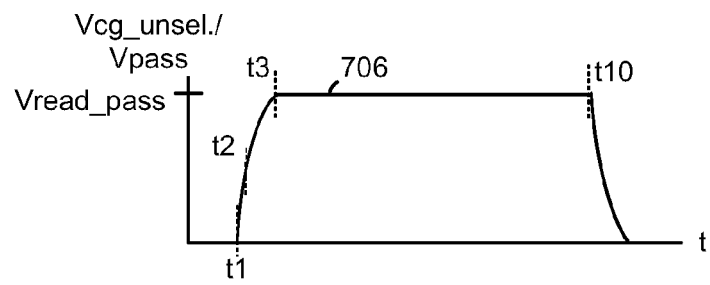
Fig. 7C1
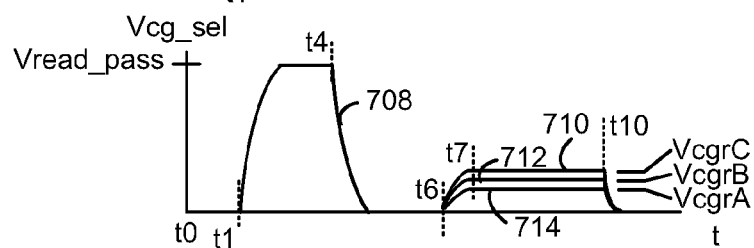
Fig. 7D
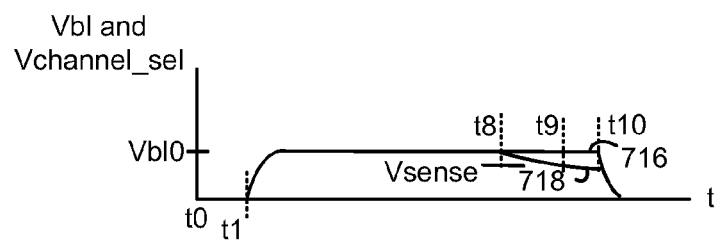
Fig. 7E
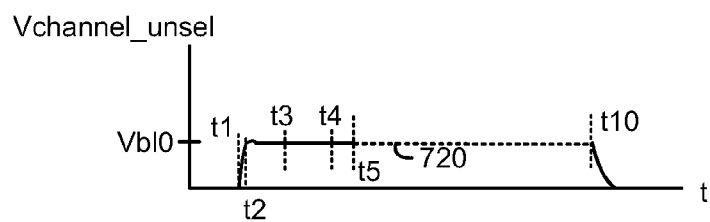
Fig. 7F1

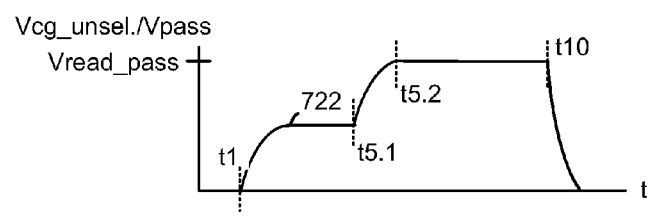
Fig. 7C2
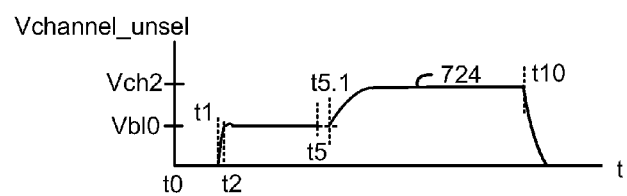
Fig. 7F2

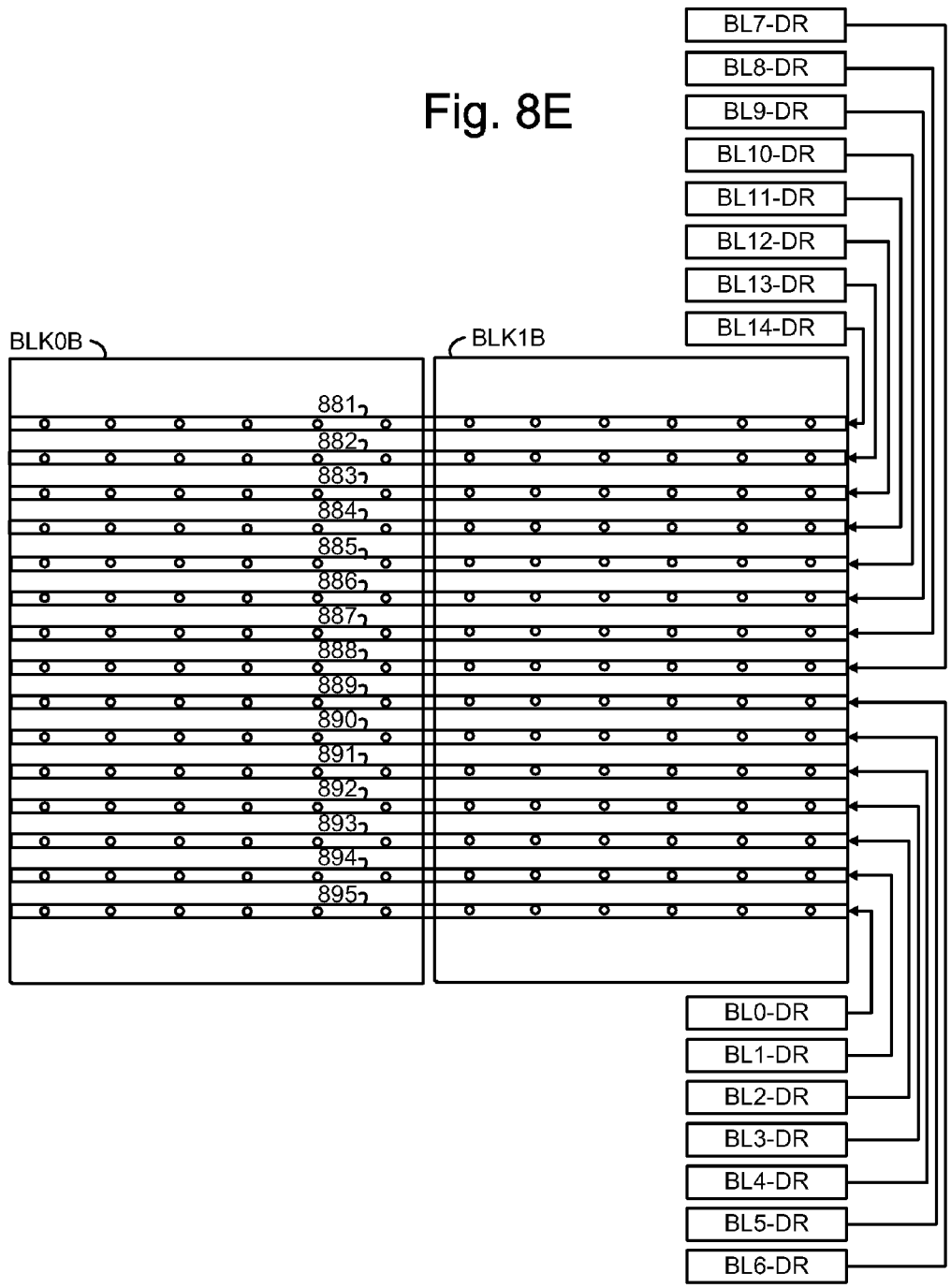

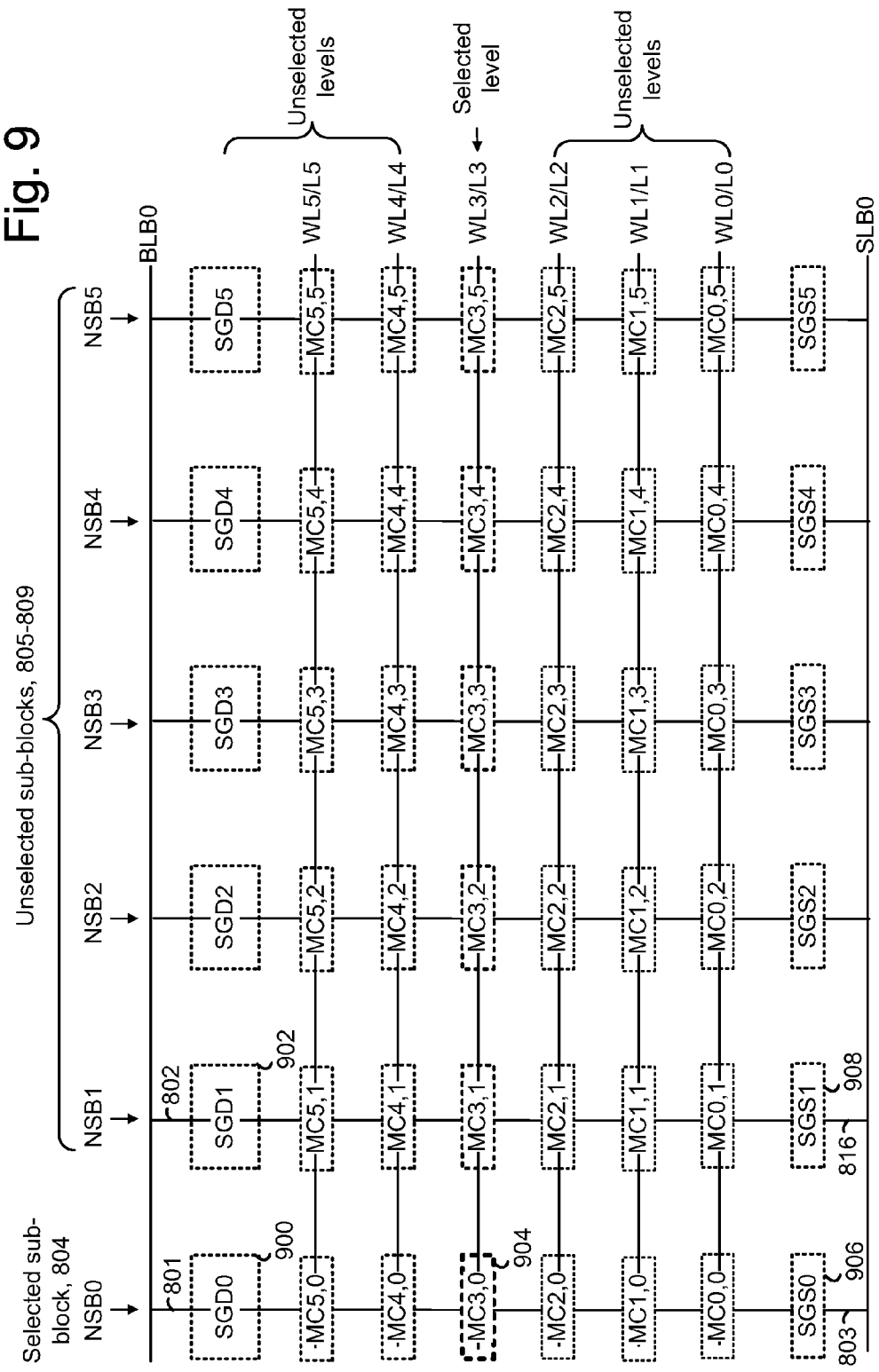

REDUCING WEAK-ERASE TYPE READ DISTURB IN 3D NON-VOLATILE MEMORY

CROSS-REFERENCE TO RELATED APPLICATIONS

This is a continuation application of U.S. patent application Ser. No. 14/071,288, filed Nov. 4, 2014, and published as US 2014/056065 on Feb. 27, 2014, which is a continuation application of U.S. patent application Ser. No. 13/364,518, filed Feb. 2, 2012, published as US 2013/0201760 on Aug. 8, 2013 and issued as U.S. Pat. No. 8,670,285 on Mar. 11, 2014, all of which are incorporated herein by reference.

BACKGROUND

The present technology relates to techniques for reading memory cells in a 3D-non-volatile memory device.

Recently, ultra high density storage devices have been proposed using a 3D stacked memory structure sometimes referred to as a Bit Cost Scalable (BiCS) architecture. For example, a 3D NAND stacked memory device can be formed from an array of alternating conductive and dielectric layers. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

BRIEF DESCRIPTION OF THE DRAWINGS

Like-numbered elements refer to common components in the different figures.

FIG. 1C depicts an embodiment of block BLK0 of FIG. 1A which includes U-shaped NAND strings, where a set of U-shaped NAND strings associated with a common bit line is highlighted.

FIG. 3 depicts an arrangement of memory cells in an example set of NAND strings such as SetA0 in FIG. 2E.

FIG. 5A depicts a read operation for a block of memory cells.

FIG. 5B depicts an embodiment of the read operation of FIG. 5A.

FIG. 5C depicts another embodiment of the read operation of FIG. 5A.

FIG. 5D depicts another embodiment of the read operation of FIG. 5A.

FIG. 5E depicts another embodiment of the read operation of FIG. 5A.

FIG. 5F depicts another embodiment of the read operation of FIG. 5A.

FIG. 5G depicts another embodiment of the read operation of FIG. 5A.

FIGS. 6A1 to 6D2 depict waveforms associated with the embodiments of FIGS. 5B-5E.

FIGS. 7A to 7F2 depict waveforms associated with the embodiments of FIGS. 5F and 5G.

FIG. 8E depicts a top view of a bit line layer of the 3D non-volatile memory device of FIG. 8A, showing bit lines and associated drivers.

FIG. 9 depicts an arrangement of memory cells in an example set of NAND strings such as SetB0 in FIG. 8F.

DETAILED DESCRIPTION

Figure 1A:
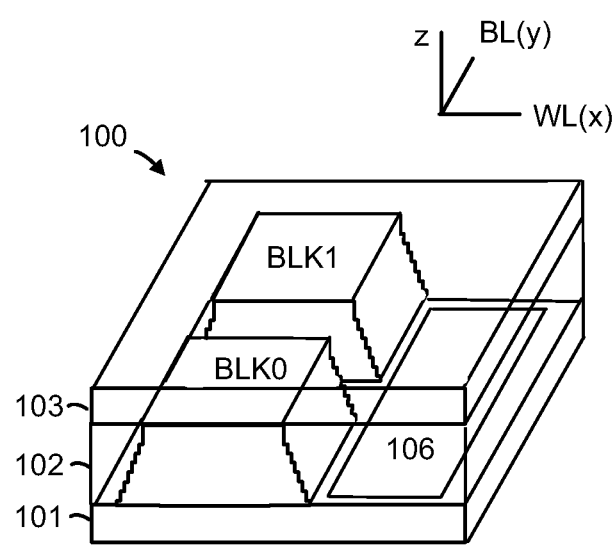
FIG. 1A is a perspective view of a 3D stacked non-volatile memory device.

In a 3D stacked non-volatile memory device, a read operation which is performed to read the state of selected memory cells can adversely impact the state of unselected memory cells in a process referred to a read disturb. For example, the 3D stacked non-volatile memory device can be arranged in multiple blocks, where each block includes multiple sub-blocks, and a read operation is performed on a selected sub-block of a block. The different sub-blocks can have the same word line layer, bit line and source line biases, but typically have separate select gate (SG) biases for source-side select gates (SGS) and drain-side select gates (SGD). During the read in the selected sub-block, the SGS and SGD transistors of the unselected sub-blocks are typically turned off (made non-conductive) to cut off the conduction paths in unselected strings of the memory cells. A read-pass voltage (Vread_pass) of about 7~8 V is applied to the unselected word line layers, boosting a peak channel potential of the unselected strings to above 5 V. This full measure of boosting is due to capacitive coupling from the unselected word line layers to the channel.

This channel boosting can help reduce the occurrence of normal read disturb for the unselected cells of the unselected strings. Normal read disturb results in an increase (or a decrease, in some cases) in the threshold voltage of an unselected cell in a read operation. Normal read disturb is caused by a large potential difference between the control gate and channel of a cell.

However, when a cell is being read with a relatively low voltage (Vcgr) on the selected word line layer, the relatively high channel boosting potential during read can draw charge out of a region of the channel which is associated with the selected cell, lowering the threshold voltage (Vth) of the cell and thereby weakly erasing of the cell. This problem is most apparent when the cell has a relatively high Vth, e.g., is programmed to a relatively high data state. This weak-erase type of read disturb can cause an error in the data stored by a cell, adversely impact the performance of the memory device.

The weak-erase type of read disturb can be suppressed by turning on (making conductive) select gates in all sub-blocks when the select gate transistors ramp up to completely discharge the channels. However, the potentials in the channels of the unselected strings will be too low (e.g., 0 V) during the read operation, so that the normal read disturb occurs.

A better approach, as described herein, carefully controls the level of channel boosting of unselected strings during a read operation by controlling the boosting process. In particular, the SGS and/or SGD select gates can be temporarily made conductive during a read operation to allow a reduced amount of channel boosting which is less than the full measure of channel boosting. The reduced amount of channel boosting is sufficient to repress normal read disturb but not so high as to encourage weak-erase type of read disturb.

In the discussion below, structural details of 3D stacked non-volatile memory devices are provided generally in FIGS. 1A to 3 and 8A to 9, and details of a read operation are provided generally in FIGS. 4 to 7C.

FIG. 1A is a perspective view of a 3D stacked non-volatile memory device. The memory device 100 includes a substrate 101. On the substrate are example blocks BLK0 and BLK1 of memory cells and a peripheral area 106 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers, and the width of the plane, in the y-direction, represents a direction in which signal paths to bit lines extend in the one or more upper metal layers. The z-direction represents a height of the memory device.

Figure 1B:
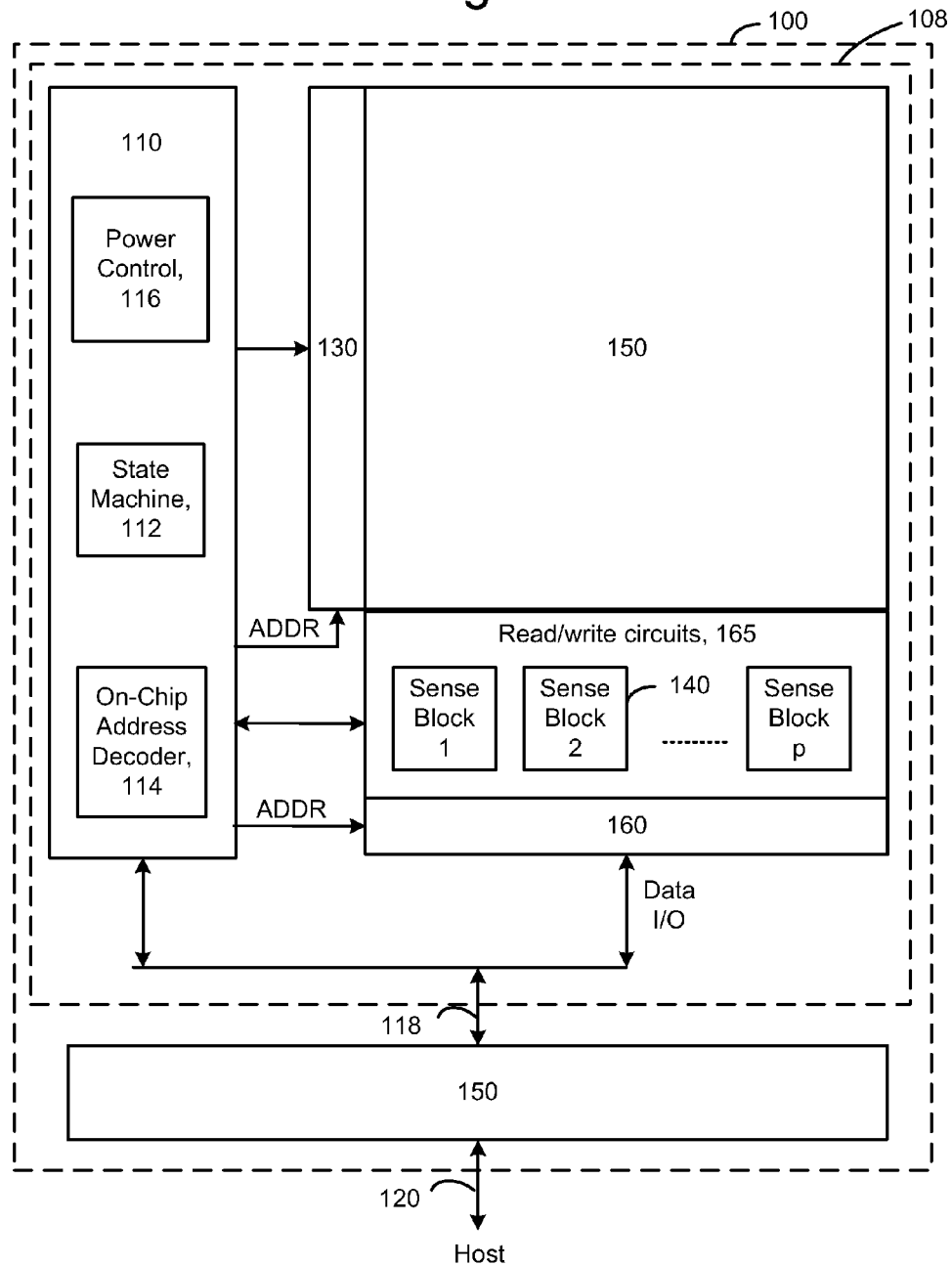
FIG. 1B is a functional block diagram of the 3D stacked non-volatile memory device 100 of FIG. 1A.

FIG. 1B is a functional block diagram of the 3D stacked non-volatile memory device 100 of FIG. 1A. The memory device 100 may include one or more memory die 108. The memory die 108 includes a 3D (three-dimensional) memory array of storage elements 150, e.g., including the blocks BLK0 and BLK1, control circuitry 110, and read/write circuits 165. The memory array 150 is addressable by word lines via a row decoder 130 and by bit lines via a column decoder 160. The read/write circuits 165 include multiple sense blocks 140 (sensing circuitry) and allow a page of storage elements to be read or programmed in parallel. Typically a controller 150 is included in the same memory device 100 (e.g., a removable storage card) as the one or more memory die 108. Commands and data are transferred between the host and controller 150 via lines 120 and between the controller and the one or more memory die 108 via lines 118.

The control circuitry 110 cooperates with the read/write circuits 165 to perform memory operations on the memory array 150, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 130 and 160. The power control module 116 controls the power and voltages supplied to the word lines and bit lines during memory operations. It can includes drivers for word line layers and word line layer portions, drain- and source-side select gate drivers (referring, e.g., to drain- and source-sides or ends of a string of memory cells such as a NAND string, for instance) and source lines. The sense blocks 140 can include bit line drivers, in one approach.

In some implementations, some of the components can be combined. In various designs, one or more of the components (alone or in combination), other than memory array 150, can be thought of as at least one control circuit. For example, at least one control circuit may include any one of, or a combination of, control circuitry 110, state machine 112, decoders 114/160, power control 116, sense blocks 140, read/write circuits 165, and controller 150, and so forth.

In another embodiment, a non-volatile memory system uses dual row/column decoders and read/write circuits. Access to the memory array 150 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 150. In this way, the density of the read/write modules is reduced by one half.

Other types of non-volatile memory in addition to NAND flash memory can also be used.

FIG. 1C depicts an embodiment of block BLK0 of FIG. 1A which includes U-shaped NAND strings. The block BLK0A includes U-shaped NAND strings arranged in sets (SetA0, SetA1, SetA2, SetA3, . . . , SetAn, where there are n−1 sets in a block). Each set of NAND strings is associated with one bit line (BLA0, BLA1, BLA2, BLA3, . . . , BLAn). In one approach, all NAND strings in a block which are associated with one bit line are in the same set. Each U-shaped NAND string thus has two columns of memory cells—a drain-side column and a source-side column. For example, SetA0 includes NAND strings NSA0 (having drain-side column C0 and source-side column C1), NSA1 (having drain-side column C3 and source-side column C2), NSA2 (having drain-side column C4 and source-side column C5), NSA3 (having drain-side column C7 and source-side column C6), NSA4 (having drain-side column C8 and source-side column C9) and NSA5 (having drain-side column C11 and source-side column C10). Source lines extend transversely to the bit lines and include SLA0, SLA1 and SLA2. The source lines join the source-side columns of adjacent NAND string in a set. For example, SLA0 joins C1 and C2, SLA1 joins C5 and C6 and SLA2 joins C9 and C10. In one approach, the source lines in a block are joined to one another and driven by one driver. The bit lines and the source lines are above the memory cell array in this example.

NAND strings 170-173 are in the same sub-block as NSA0.

Figure 1D:
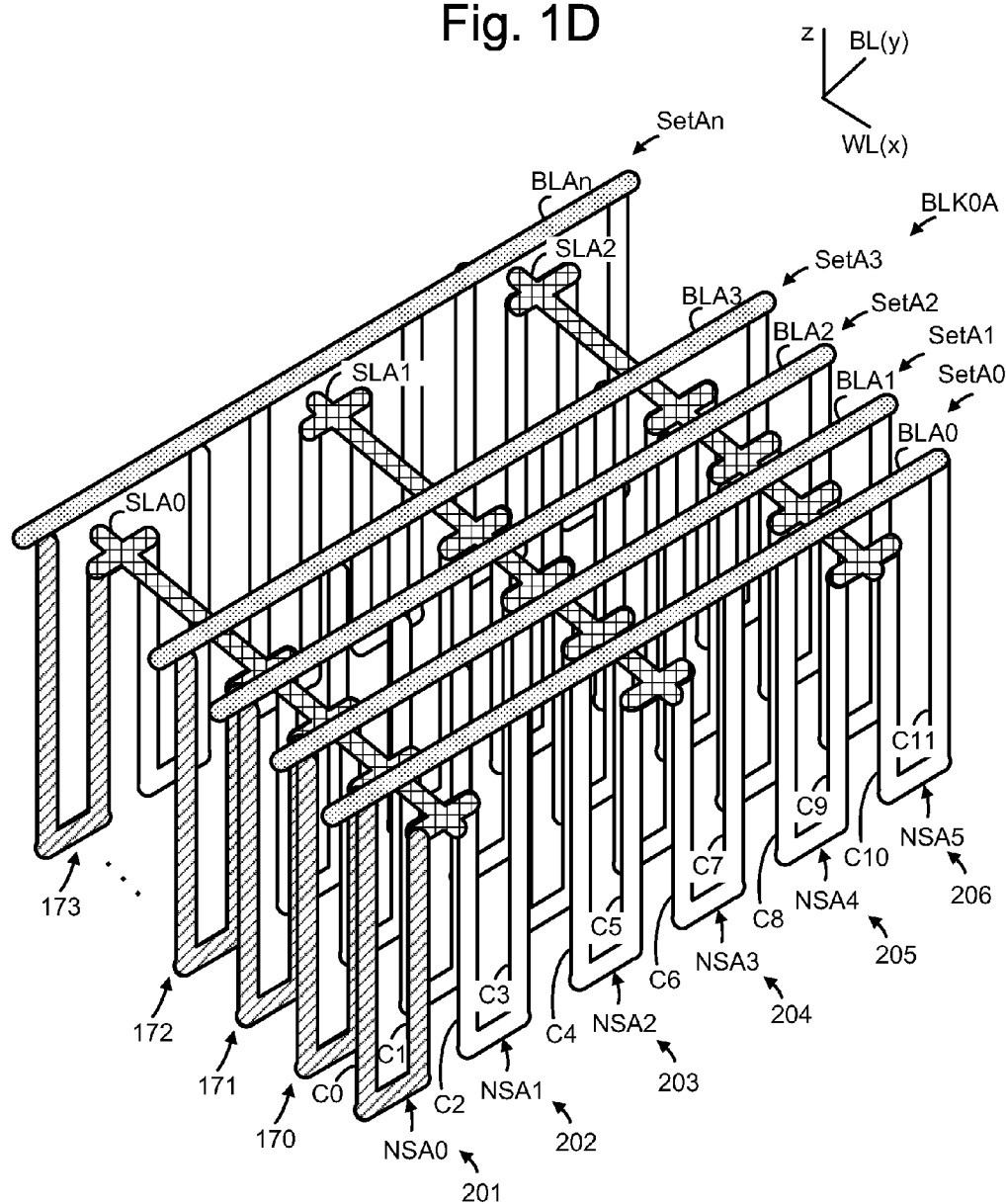
FIG. 1D depicts the embodiment of FIG. 1C, where a sub-block of U-shaped NAND strings is highlighted.

FIG. 1D depicts the embodiment of FIG. 1C, where an example sub-block of U-shaped NAND strings is highlighted by diagonal lines. A block can be divided into sub-blocks. When U-shaped NAND strings are used, each sub-block can include a set of NAND strings which extend in the x direction. For example, one sub-block comprises NSA0 and NAND strings 170-173, another sub-block comprises NSA1 and the NAND string behind it in the −x direction, and so forth. Each NAND string includes a drain-side column of memory cells and a source side column of memory cells as discussed further in connection with FIG. 2A, for instance. Ends of the source side columns in a sub-block are connected to a common select line. For example, the ends of the source side columns in the sub-block 201 are connected to SLA0.

Figure 1E:
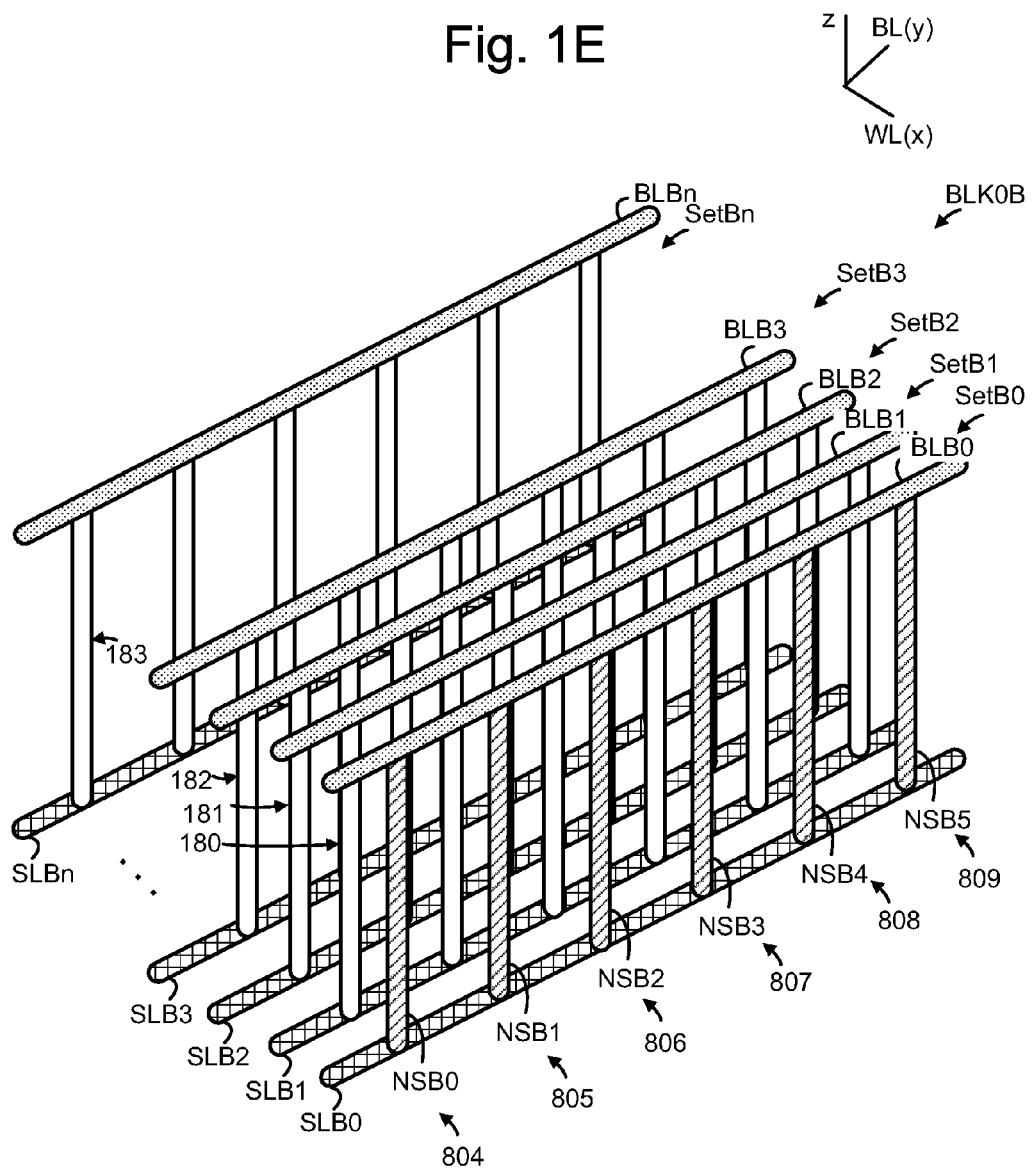
FIG. 1E depicts an embodiment of block BLK0 of FIG. 1A, where a set of straight NAND strings associated with a common bit line is highlighted.

FIG. 1E depicts an embodiment of block BLK0 of FIG. 1A which includes straight NAND strings. The block BLK0B includes straight NAND strings arranged in sets (SetB0, SetB1, SetB2, SetB3, . . . , SetBn, where there are n−1 sets in a block). Each set of NAND strings is associated with one bit line (BLB0, BLB1, BLB2, BLB3, . . . , BLBn). In one approach, all NAND strings in a block which are associated with one bit line are in the same set. Each straight NAND string has one column of memory cells. For example, SetA0 includes NAND strings NSB0, NSB1, NSB2, NSB3, NSB4 and NSB5. Source lines extend parallel to the bit line and include SLB0, SLB1, SLB2, SLB3, . . . , SLBn. In one approach, the source lines in a block are joined to one another and driven by one driver. The bit lines are above the memory cell array and the source lines are below the memory cell array in this example. Each block can include sub-blocks of columns of memory cells, such as sub-blocks 804 to 809 in BLK0B. See FIGS. 1F and 8A for further details.

Figure 1F:
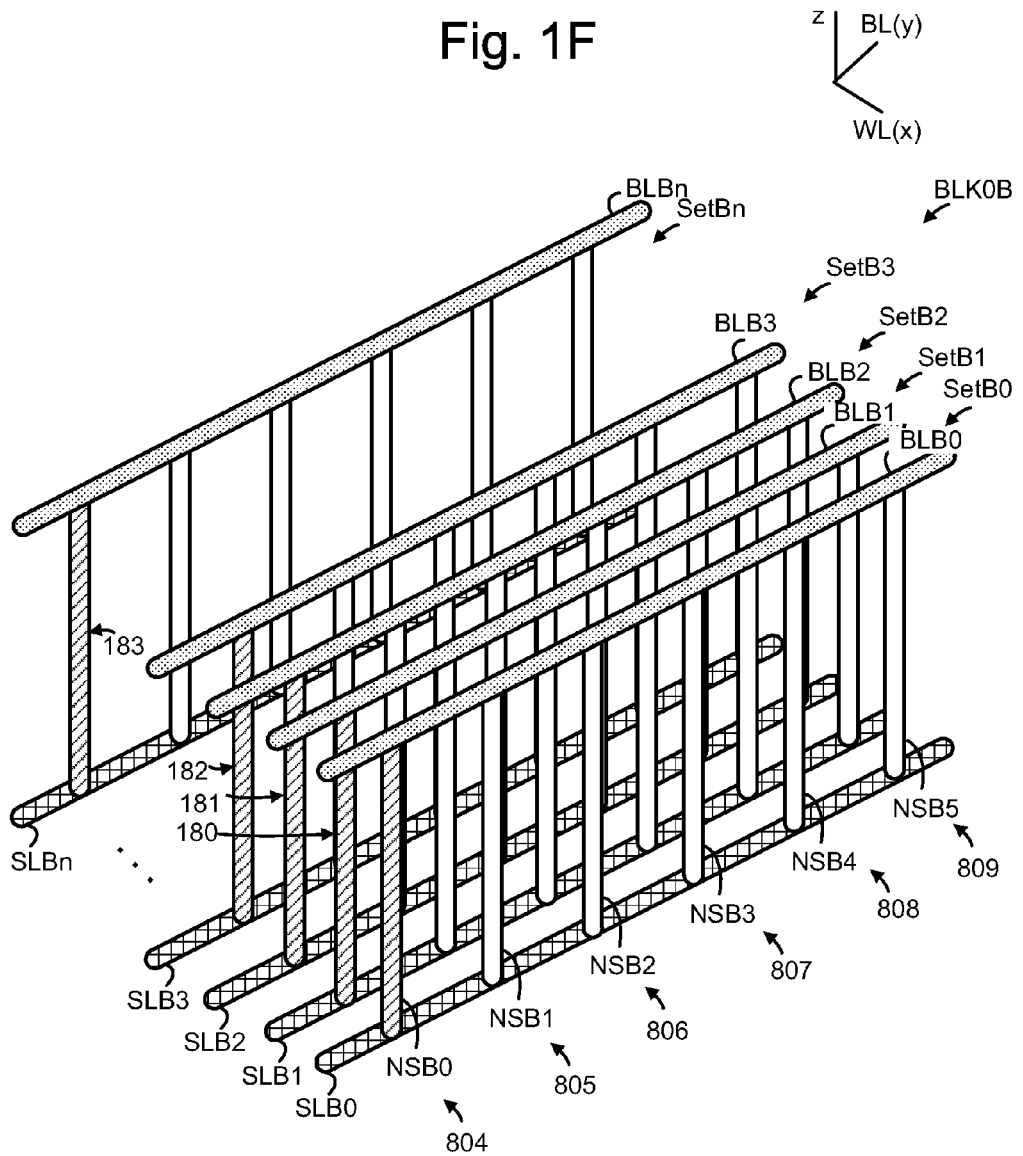
FIG. 1F depicts the embodiment of FIG. 1E, where a sub-block of straight NAND strings is highlighted.

FIG. 1F depicts the embodiment of FIG. 1E, where a sub-block of straight NAND strings is highlighted by diagonal lines. Each sub-block includes a set of NAND strings which extend in the x direction. For example, sub-block 804 includes straight NAND string NSB0 and the NAND strings 180-183 which are behind NSB0. The other sub-blocks 804 to 809 include NSB1-NSB5, respectively and the NAND strings behind them in the −x direction.

Figure 2A:
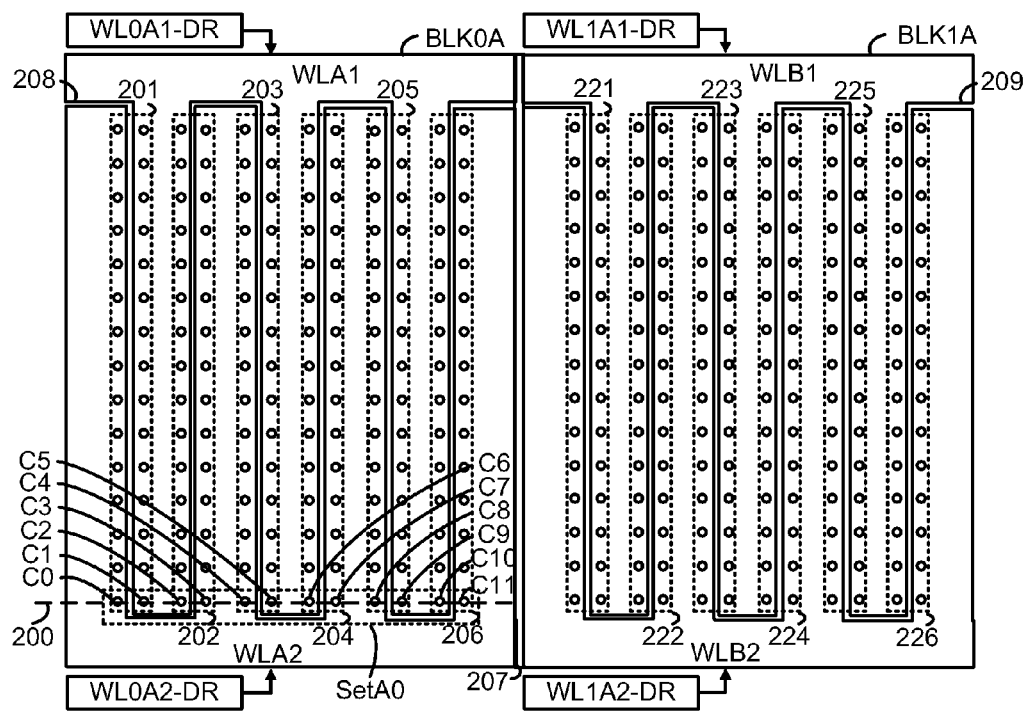
FIG. 2A depicts a top view of a word line layer of a 3D non-volatile memory device having U-shaped NAND strings, consistent with FIG. 1C, showing word line layer portions and associated drivers.

FIG. 2A depicts a top view of a word line layer of a 3D non-volatile memory device having U-shaped NAND strings, consistent with FIG. 1C, showing word line layer portions and associated drivers. This is a representative layer among the multiple word line layers in a stack. Referring also to FIG. 2E, the stack includes alternating dielectric and conductive layers or levels. The dielectric layers or levels include D0 to D8 and may be made of SiO2, for instance. The conductive layers or levels include BG, which is a back gate layer, WL0 to WL6, which form word line layers, e.g., conductive paths to control gates of the memory cells at the layer, and SG, which forms a select gate layer, e.g., a conductive path to control gates of select gates of NAND strings. WL0-WL6 are at levels L0-L6, respectively. The word line layer of FIG. 2A may represent any one of WL0 to WL6, for instance. The conductive layers may include doped polysilicon or metal silicide, for instance. An example voltage of 5-10 V may be applied to the back gate to maintain a conductive state which connects the drain- and source-side columns.

FIG. 2A depicts the block BLK0A of FIG. 1C and a similar block BLK1A as an example. For each block, the word line layer is divided into two word line layer portions, e.g., word line layer portions WLA1 and WLA2 in BLK0A, and word line layer portions WLB1 and WLB2 in BLK1A. Each block includes a slit pattern. A slit refers, e.g., to a void which extends vertically in the stack, typically from an etch stop layer at the bottom to at least a top layer of the stack. The slit can be filled with insulation to insulate words line layer portions from one another. A slit 208 of BLK0A is a single continuous slit which extends in a zig-zag pattern in the block so that the block is divided into two portions, WLA1 and WLA2, which are insulated from one another. Similarly, a slit 209 of BLK1A divides BLK1A into two portions, WLB1 and WLB2, which are insulated from one another. This approach can provide greater flexibility in controlling the memory cells since the word line layer portions can be drive independently.

Each block includes rows of columnar, e.g., vertical, memory holes or pillars, represented by circles. Each row represents a vertical group of columns in the figure. The memory holes extend vertically in the stack and include memory cells such as in a vertical NAND string. Example columns of memory cells in BLK0A along a line 200 include C0 to C11. The figure represents a simplification, as many more rows of memory holes will typically be used, extending to the right and left in the figure. Also, the figures are not necessarily to scale. The columns of memory cells can be arranged in sub-blocks 201 to 206 in BLK0A and 221 to 226 in BLK1A. When U-shaped NAND strings are used, each sub-block can include two adjacent rows of columns of memory cells. In a sub-block, the adjacent rows are separated by the slit. The columns of memory cells on one side of the slit are drain-side columns (e.g., C0, C3, C4, C7, C8 and C11 in FIG. 2E), and the columns of memory cells on the other side of the slit are source-side columns (e.g., C1, C2, C5, C6, C9 and C10 in FIG. 2E). Note that the pattern of two source-side columns between two drain-side columns repeats in the y-direction.

Word line drivers WL0A1-DR, WL0A2-DR, WL1A1-DR and WL1A2-DR independently provide signals such as voltage waveforms to the word line layer portions WLA1, WLA2, WLB1 and WLB2, respectively.

The drawings are not to scale and do not show all memory columns. For example, a more realistic block might have 12 memory columns in the y direction as shown, but a very large number such as 32 k memory columns in the x direction, for a total of 384 k memory columns in a block. With U-shaped NAND strings, this is 192K NAND strings. With straight NAND strings, this is 384 k NAND strings.

Figure 2B:
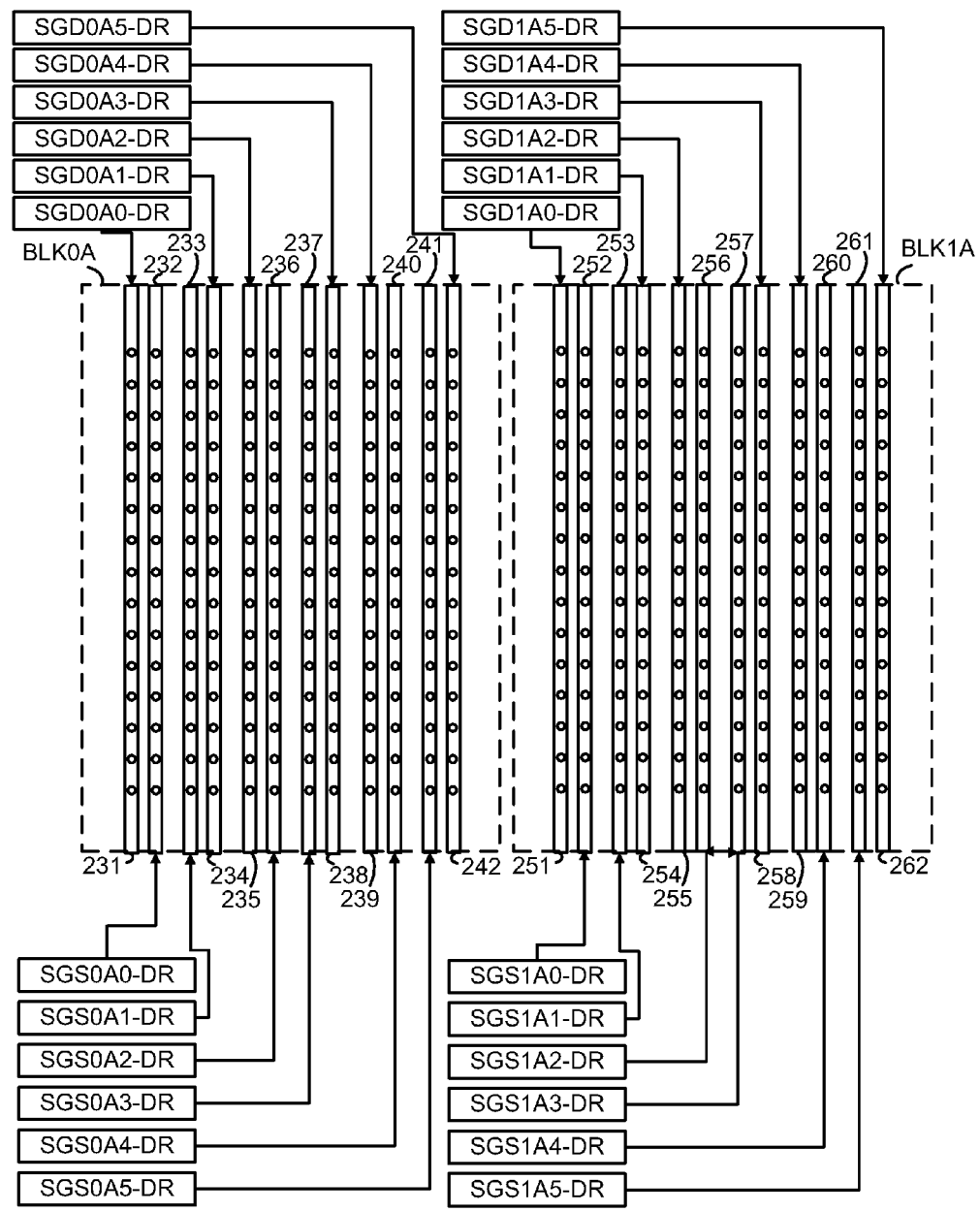
FIG. 2B depicts a top view of a select gate layer of the 3D non-volatile memory device of FIG. 2A, showing drain-side select gate lines, source-side select gate lines and associated drivers.

FIG. 2B depicts a top view of a select gate layer of the 3D non-volatile memory device of FIG. 2A, showing drain-side select gate lines, source-side select gate lines and associated drivers. For example, this can represent layer SG of FIG. 2E. A separate select gate line, e.g., a conductive line or path, is associated with each row of columns of memory cells. Moreover, separate select gate lines can be connected to the drain- and source-side columns of a U-shaped NAND string. For example, BLK0A includes drain-side select gate lines 231, 234, 235, 238, 239 and 242, which are driven by select gate drivers SGD0A0-DR to SGD0A5-DR, respectively, and source-side select gate lines 232, 233, 236, 237, 240 and 241, which are driven by select gate drivers SGS0A0-DR to SGS0A5-DR, respectively (DR denotes driver). Similarly, BLK1 includes drain-side select gate lines 251, 254, 255, 258, 259 and 262, which are driven by select gate drivers SGD6-DR to SGD11-DR, respectively, and source-side select gate lines 252, 253, 256, 257, 260 and 261, which are driven by select gate drivers SGS0A1-DR to SGS1A5-DR, respectively. The select gate drivers provide signals such as voltage waveforms to the select gate lines.

Figure 2C:
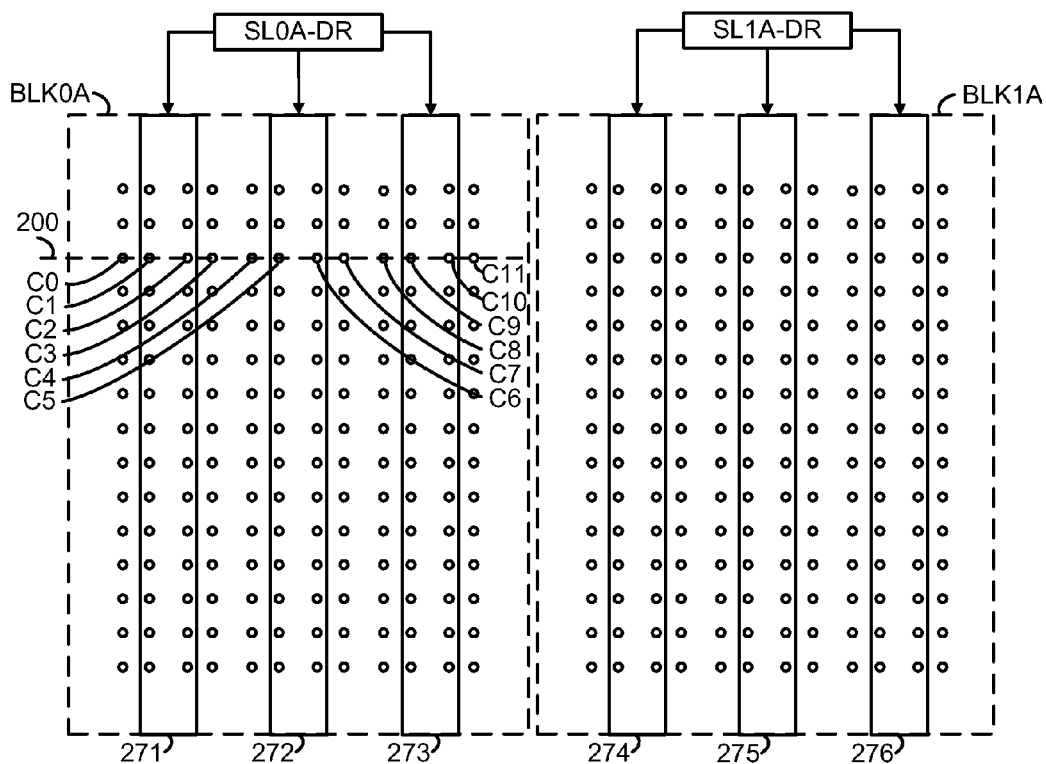
FIG. 2C depicts a top view of a source line layer of the 3D non-volatile memory device of FIG. 2A, showing source lines and associated drivers.

FIG. 2C depicts a top view of a source line layer of the 3D non-volatile memory device of FIG. 2A, showing source lines and associated drivers. For example, this can represent layer SL of FIG. 2E. A source line, e.g., a conductive line or path, is associated with pairs of rows of source-side columns of memory cells. A source line is connected to a source-side end of a U-shaped or straight NAND string. For example, BLK0A includes source lines 271 (e.g., connected to C0 and C1), 272 (e.g., connected to C5 and C6) and 273 (e.g., connected to C9 and C10). Similarly, BLK1A includes source lines 274, 275 and 276. The source line drivers provide signals such as voltage waveforms to the source lines. For example, SL0A-DR provides signals to source lines 271 to 273, and SL1A-DR provides signals to source lines 274 to 276.

Figure 2D:
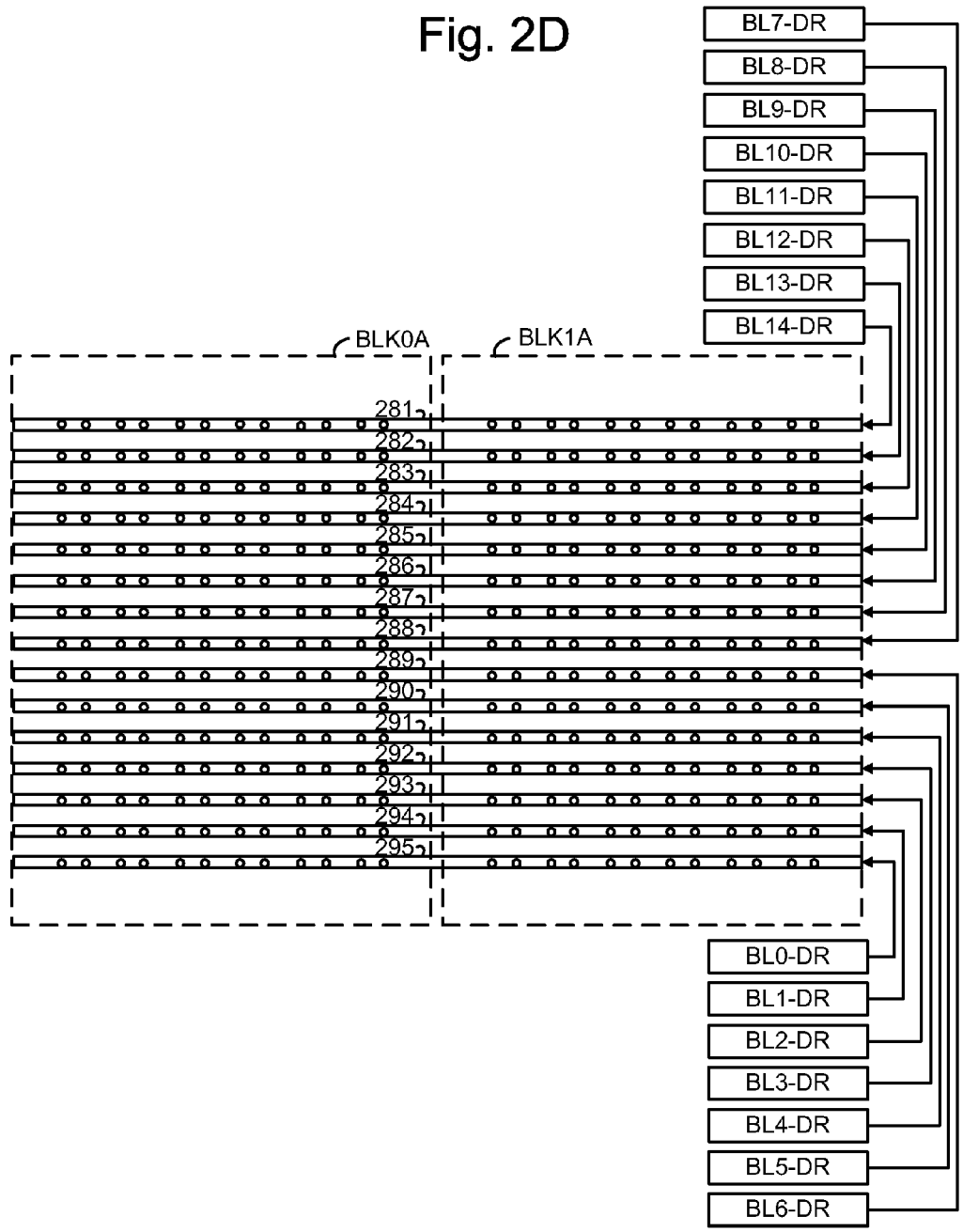
FIG. 2D depicts a top view of a bit line layer of the 3D non-volatile memory device of FIG. 2A, showing bit lines and associated drivers.
Figure 2E:
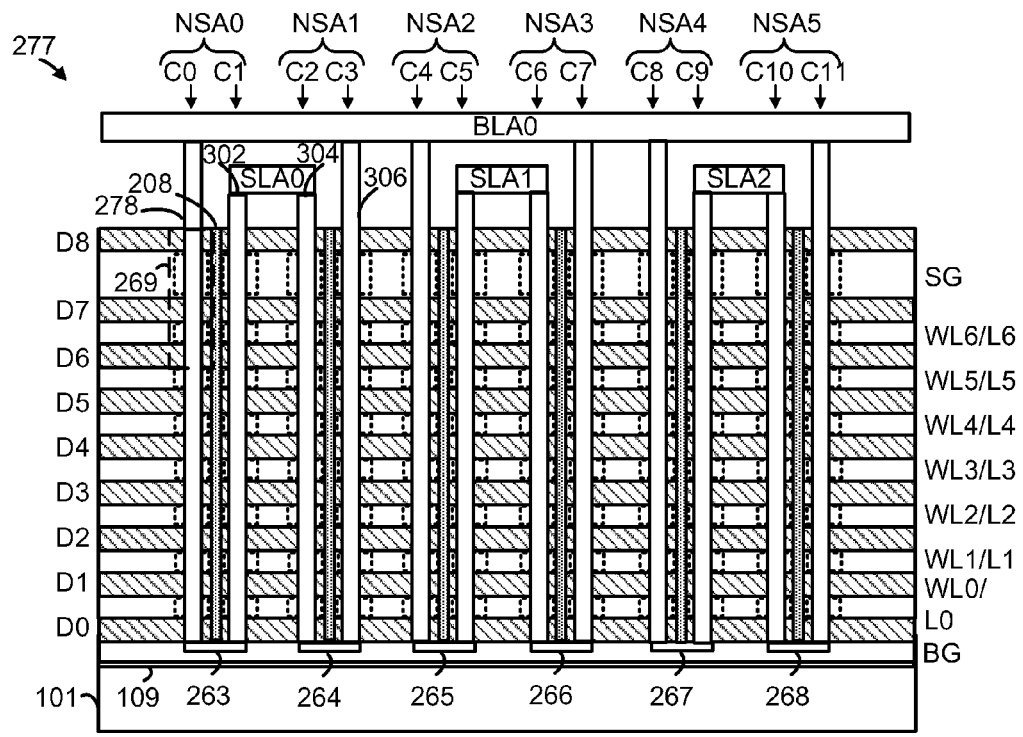
FIG. 2E depicts a cross-sectional view of a block of the 3D non-volatile memory device of FIG. 2A, along line 200 of SetA0 of NAND strings of FIG. 2A.

FIG. 2D depicts a top view of a bit line layer of the 3D non-volatile memory device of FIG. 2A, showing bit lines and associated drivers. For example, this can represent layer BL of FIG. 2E. A bit line, e.g., a conductive line or path, is associated with a set of columns of memory cells which extend in a horizontal line in the figure. A bit line extends across multiple blocks which are adjacent laterally of one another. A bit line is connected to a drain-side end of a U-shaped or straight NAND string, e.g., to a vertical channel or body of the NAND string. For example, bit lines 281 to 295 are driven by bit line drivers BL0-DR to BL14-DR, respectively. The bit line drivers provide signals such as voltage waveforms to the ends of the NAND strings. Each bit line can be independently driven.

FIG. 2E depicts a cross-sectional view of a block of the 3D non-volatile memory device of FIG. 2A, along line 200 of SetA0 of NAND strings of FIG. 2A. Columns of memory cells C0 to C11 are depicted in the multi-layer stack. The stack 277 includes the substrate 101, an insulating film 109 on the substrate, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 263 to 268 which connect the columns. The back gate thus connects the two columns of each U-shaped NAND string. For example, NSA0 includes columns C0 and C1 and connecting portion 263. NSA0 has a drain end 278 and a source end 302. NSA1 includes columns C2 and C3 and connecting portion 264. NSA1 has a drain end 306 and a source end 304. NSA2 includes columns C4 and C5 and connecting portion 265. NSA3 includes columns C6 and C7 and connecting portion 266. NSA4 includes columns C8 and C9 and connecting portion 267. NSA5 includes columns C10 and C11 and connecting portion 268.

The source line SLA0 is connected to the source ends 302 and 304 of two adjacent memory strings NSA0 and NSA1, respectively, in the SetA0 of memory strings. The source line SLA0 is also connected to other sets of memory strings which are behind NSA0 and NSA1 in the x direction. Recall that additional U-shaped NAND strings in the stack 277 extend behind the U-shaped NAND strings depicted in the cross-section, e.g., along the x-axis. The U-shaped NAND strings NSA0 to NSA5 are each in a different sub-block, but are in a common set of NAND strings (SetA0).

The slit portion 208 from FIG. 2A is also depicted as an example. In the cross-section, multiple slit portions are seen, where each slit portion is between the drain- and source-side columns of a U-shaped NAND string. Portions of the source lines 271 to 273 are also depicted. A portion of the bit line BLA0 is also depicted.

Short dashed lines depict memory cells and select gates, as discussed further below.

Figure 2F:
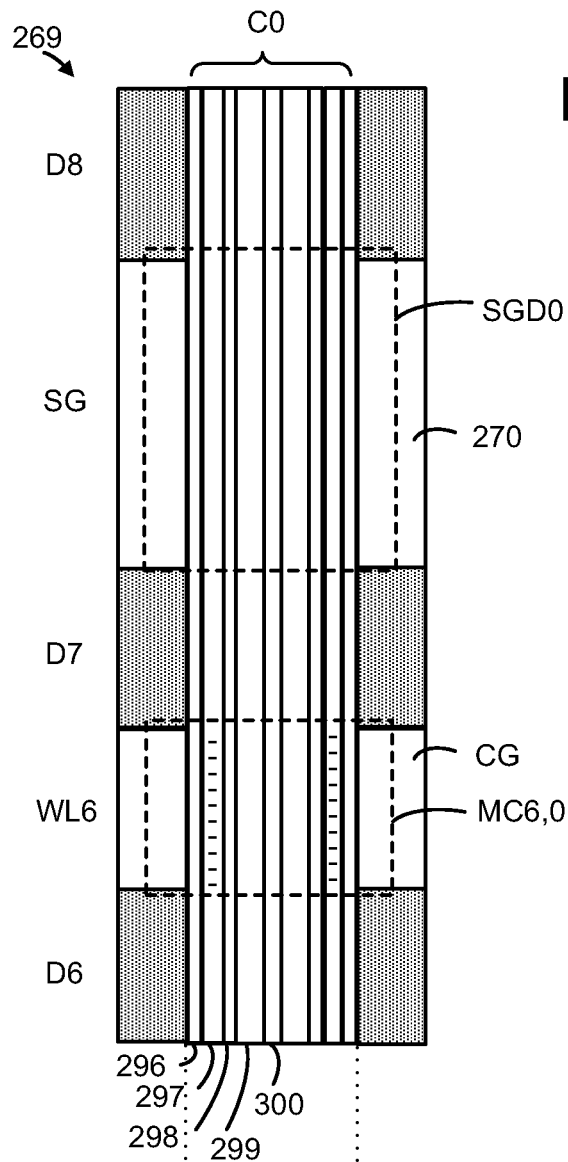
FIG. 2F depicts a close-up view of the region 269 of the column C0 of FIG. 2E, showing a drain-side select gate SGD0 and a memory cell MC6,0.

A region 269 of the stack is shown in greater detail in FIG. 2F.

FIG. 2F depicts a close-up view of the region 269 of the column C0 of FIG. 2E, showing a drain-side select gate SGD0 and a memory cell MC6,0. See also FIG. 3, where this notation is also used. The region shows portions of the dielectric layers D6 to D8 and the conductive layers WL6 and SG. Each column includes a number of layers which are deposited along the sidewalls of the column. These layers can include oxide-nitride-oxide and polysilicon layers which are deposited, e.g., using atomic layer deposition. For example, a block oxide can be deposited as layer 296, a nitride such as SiN as a charge trapping layer can be deposited as layer 297, a tunnel oxide can be deposited as layer 298, a polysilicon body or channel can be deposited as layer 299, and a core filler dielectric can be deposited as region 300. Additional memory cells are similarly formed throughout the columns.

Figure 2G:
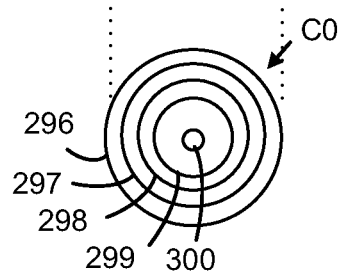
FIG. 2G depicts a cross-sectional view of the column C0 of FIG. 2F.

When a memory cell is programmed, electrons are stored in a portion of the charge trapping layer which is associated with the memory cell. For example, electrons are represented by "-" symbols in the charge trapping layer 297 for MC6,0. These electrons are drawn into the charge trapping layer from the polysilicon body, and through the tunnel oxide. The threshold voltage of a memory cell is increased in proportion to the amount of stored charge. During the weak-erase type read disturb, discussed previously, an electric field across the tunnel oxide can causes holes to be injected from the memory cell's body to the charge trapping layer, resulting in a Vth downshift. FIG. 2G depicts a cross-sectional view of the column C0 of FIG. 2F. Each layer is ring-shaped in one possible approach, except the core filler which is cylindrical.

A region 270, which can encircle the column C0, provides a control gate of SGD0. A region C0, which can encircle the column C0, provides a control gate of the memory cell MC6,0.

FIG. 3 depicts an arrangement of memory cells in an example set of NAND strings such as SetA0 in FIG. 2E. NAND strings NSA0 to NSA5 and their columns of memory cells are depicted. For convenience, a notation is used in which SGD denotes a drain-side select gate of a NAND string, e.g., the select gate at the top of the drain-side column of a U-shaped NAND string. Each SGD is numbered, starting from 0 and proceeding left to right across the figures, e.g., from SGD0 to SGD5. SGS denotes a source-side select gate of a NAND string, e.g., the select gate at the top of the source-side column of a U-shaped NAND string. Each SGS is also numbered, starting from 0 and proceeding left to right across the figures, e.g., from SGS0 to SGS5.

Each memory cell is numbered in a (z,y) format where z denotes a word line layer or level of the memory cell and y denotes the position of the memory cell in the word line layer or level. For example, memory cells connected to WL0, WL1, WL2, WL3, WL4, WL5 and WL6 are numbered as MC0,0-MC0,11, MC1,0-MC1,11, MC2,0-MC2,11, MC3,0-MC3,11, MC4,0-MC4,11, MC5,0-MC5,11, and MC6,0-MC6,11, respectively, proceeding left to right across the figures. WL0, WL1, WL2, WL3, WL4, WL5 and WL6 denote word line layer portions at a given level or height in the stack. The notation L0-L6 denotes the levels of WL0-WL6, respectively.

Additionally, a heavy dashed line border of a memory cell indicates a selected memory cell which has been selected in a read operation. A lighter dashed line border of a memory cell indicates an unselected memory cell which has not been selected in a read operation.

Recall that each word line layer can have two, inter-digitated word line layer portions as set forth in FIG. 2A. In one approach, only the memory cells of one of the word line layer portions are selected to be read. In another approach, as shown here, the memory cells of both of the word line layer portions in a sub-block are selected to be read. For example, the memory cells which are at a selected level and which are in a selected sub-block are selected to be read. In this example, MC3,0 306 and MC3,1 308 are in a selected sub-block 201 which includes NSA0 and the NAND strings behind it in the x-direction, and are selected to be read in a read operation. L3 is a selected level of the block. The other memory cells (i.e., MC3,2-MC3,11) at the selected level but in the five unselected sub-blocks 202-206 (associated with NSA1-NSA5, respectively) are not selected to be read in the current read operation. They can be selected in a subsequent read operation if desired. Further, the memory cells in the unselected levels (i.e., WL0/L0-WL2/L2 and WL4/L4-WL6/L6) are unselected memory cells which are not selected to be read in the read operation. L0-L2 and L4-L6 are unselected levels of the block.

Generally, a read operation can involve a selected level (representing a word line layer or more word line layer portion), and all, or fewer than all, of the memory cells in a selected sub-block. In the nominal case, all memory cells in a selected level and in a selected sub-block are selected to be read.

With NSA0 being part of the selected sub-block 201 (FIG. 1C) in this example, the memory cells in the multiple levels of memory cells of the block are arranged in at least one selected string of memory cells (NSA0) and at least one unselected string of memory cells (NSA1-NSA5). The at least one selected string of memory cells includes at least one selected memory cell (MC3,0 and MC3,1). The at least one selected string of memory cells comprises a drain end 278 (FIG. 2E) with an associated first select gate (SGD0 310) and a source end 302 (FIG. 2E) with an associated second select gate (SGS0 312), and includes memory cells (MC0,0-MC6,0) in each of the multiple levels (L0-L6). The at least one unselected string of memory cells (NSA1) does not include any of the selected memory cells, and comprises a drain end 306 with an associated third select gate (SGD1 316) and a source end 304 with an associated fourth select gate (SGS1 314), and includes memory cells (MC0,1-MC6,1) in each of the multiple levels (L0-L6).

The at least one selected string of memory cells (NSA0) is in a selected sub-block 201 of a block BLK0A (FIG. 1C) of the 3D stacked non-volatile memory device. The selected sub-block includes a plurality of selected strings of memory cells NSA0 and 170-173 (FIG. 1C). The at least one unselected string of memory cells (NSA1-NSA5) is in an unselected sub-block (202-206) of the block. The unselected sub-block includes a plurality of unselected strings of memory cells (NSA1-NSA5 and the NAND strings behind them).

Figure 4:
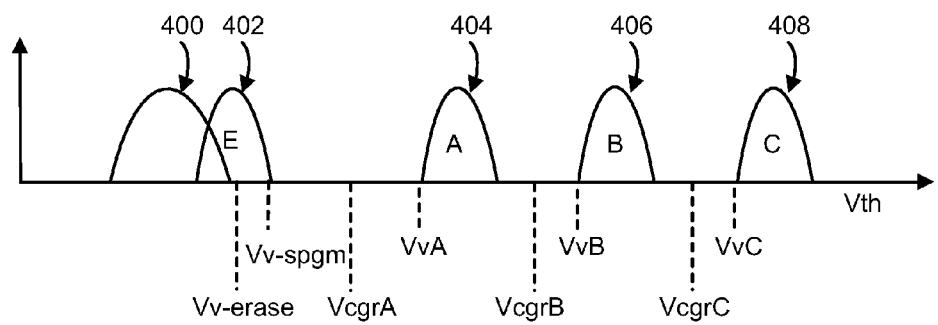
FIG. 4 depicts threshold voltage distributions of an erased state and higher data states.

FIG. 4 depicts threshold voltage distributions of an erased state and higher data states. As mentioned, memory cells can be programmed so that their threshold voltages are in respective ranges which represent data states. Initially, an erase operation is performed which places all of the memory cells in the erased state (E). Subsequently, some of the memory cells can be programmed to a higher threshold voltage such as to represent the A, B or C data states.

The x-axis indicates a threshold voltage and the y-axis indicates a number of storage elements. In this example, there are four data states (each represented by a threshold voltage distribution): an initial erased state 400, a soft programmed erased state (E) 402, an A state 404, a B state 406 and a C state 408. Memory devices with additional data states, e.g., eight or sixteen data states, can also be used. The distribution 400 is realized after the erase operation when storage elements are typically over-erased, past the erase state 402. In the erase operation, one or more erase pulses are applied to the NAND string at its source and/or drain ends, until the threshold voltage of the storage elements being erased transitions below an erase-verify level, Vv-erase which can be 0 V or close to 0V, in one approach.

Once the erase operation is completed for a block, the soft programming operation is performed, in which one or more positive voltage pulses are applied to the control gates of the storage elements, such as via a word line, to increase the threshold voltages of some or all of the storage elements in the distribution 400 closer to and below a soft programming (SPGM) verify level, Vv-spgm, to the erased state 402. For example, a certain, small fraction of the storage elements may be soft programmed to have a Vth above Vv-spgm, at which point the soft programming ends, leaving most of the other storage elements with a Vth which is close to, but below, Vv-spgm. Vv-spgm is typically above or equal to Vv-erase. The soft programming operation advantageously results in a narrow erase state distribution 402. Once the soft programming operation is complete, programming to higher data states can occur, such as to states A, B and C using verify levels VvA, VvB and VvC, respectively. A subsequent read operation can use the levels VcgrA, VcgrB and VcgrC as control gate read voltages. In one possible approach, a read operation using VreadA is performed to distinguish E-state cells from A-, B- and C-state cells, followed by a read operation using VcgrB to distinguish A-state cells from B- and C-state cells, followed by a read operation using VcgrC to distinguish B-state cells from C-state cells. An overall read operation can be considered to include read operations using each of VcgrA, VgrB and VcgrC.

FIG. 5A depicts a read operation for a block of memory cells. A read operation begins at step 500. Step 502 identifies a selected sub-block of memory cells to be read. Step 504 identifies selected memory cells in a selected sub-block. For example, all memory cells in a sub-block can be read. The memory cells to be read in the selected sub-block are selected memory cells and the associated NAND strings in which the selected memory cells are located are selected NAND strings. The memory cells which are not to be read in the selected sub-block are unselected memory cells, although these unselected memory cells can be part of selected NAND strings. A sub-block which is not currently selected to be read is an unselected sub-block and its memory cells are unselected memory cells in unselected NAND strings. In one approach, the selected memory cells store a unit of data such as a page.

The identifying steps can be performed by control circuitry. A read operation can be initiated by control circuitry of the memory device independently of an external host controller, or in response to a command from an external host controller, for instance.

Step 506 begins a channel boosting portion of the read operation. Step 508 sets initial voltages. See FIGS. 5B-7E for further details. One of two general approaches can be followed next. In one approach, step 510 sets a channel boosting level in the unselected NAND strings based on coupling from Vcg_unsel, which is the control gate voltage of the unselected memory cells, which can be applied to control gates via a word line layer or portion. Additionally, the full effect of coupling is reduced by spiking Vsgd and/or Vsgs, as discussed further in connection with FIGS. 5B-5E. In another approach, step 512 sets a channel boosting level in the unselected NAND strings to Vbl0. Vbl0 is an elevated non-zero voltage (e.g., 2-3 V) which is applied on bit lines which are connected to the unselected NAND strings (this could be all bit lines in a block). See FIG. 5F for further details. Optionally, step 514 is also performed to increase the channel boosting level in the unselected NAND strings further based on coupling from Vcg_unsel. See FIG. 5G for further details.

Step 516 begins the sensing portion of the read operation. This includes, at step 518, setting Vcg_sel to Vcgr (e.g., VcgrA, VcgrB, or VcgrC, for instance). Vcg_sel is the control gate voltage of the selected memory cells, which can be applied to control gates via a word line layer or portion. Step 520, at a sense time, senses whether Vth of the selected memory cells is above Vcgr. See FIGS. 6E and 7E for further details. Step 522 ends the read operation. The read operation can be repeated for an additional Vcgr level. Typically, N−1 read operations using Vcgr levels are used when the memory cells are programmed to N data states. The Vth of a selected memory cell is at or above Vcgr when sensing circuitry determines that the associated NAND string is non-conductive. Likewise, the Vth of a selected memory cell is below Vcgr when sensing circuitry determines that the associated NAND string is conductive.

FIG. 5B depicts an embodiment of the read operation of FIG. 5A. This approach involves: a SGD and SGS spike+ making the selected memory cell conductive+a one-step increase in Vcg_unsel. This approach is described further in connection with FIGS. 6A1, B, C, D1, E and F. In this embodiment, a spike shaped voltage is applied to both the SGD and SGS select gates. A spike shaped voltage waveform can be a voltage waveform that is increased toward a commanded level and abruptly decreased. In one approach, the voltage waveform is decreased before it reaches the commanded level. In one approach, the voltage waveform is decreased after it reaches the commanded level. A spike shaped voltage waveform can be characterized by its peak amplitude and its duration, e.g., overall duration, or duration above a specified amplitude.

Vsgd_unsel is the voltage applied to the SGD select gate of unselected NAND strings. Vsgs_unsel is the voltage applied to the SGS select gate of unselected NAND strings. Waveform 600 in FIG. 6A1 represents Vsgd_unsel and Vsgs_unsel. These voltages transition or spike up from 0 V starting at t1, exceed a level of V1 at t2, reach a peak of V2 at t3, fall below V1 at t4 and subsequently back to 0 V.

Specifically, from t1-t3, a control circuit requests Vsgd_unsel and Vsgs_unsel to be at a specified level. Due to finite response times and RC delays, the actual level of Vsgd_unsel and Vsgs_unsel will transition up over a period of time from t1-t3. In one approach, the period t1-t3 is not sufficient for Vsgd_unsel and Vsgs_unsel to reach the requested level. Instead, Vsgd_unsel and Vsgs_unsel peak at t3 at some level referred to as V2. From t2-t4, Vsgd_unsel and Vsgs_unsel are sufficiently high, e.g., above V1, so that the SGD and SGS select gates transition to a conductive state. V1 is based on factors including the Vth of the SGD and SGS select gates. The SGD and SGS select gates are in a non-conductive state before t2 and after t4. At t3, the control circuit requests Vsgd_unsel and Vsgs_unsel to be set, e.g., to 0 V, in response to which Vsgd_unsel and Vsgs_unsel decay toward 0 V.

In FIG. 6B, waveform 602 represents Vsgd_sel and Vsgs_sel, which transition from 0 V at t0 to a level referred to as V3 (>V2) at t1, remain at V3, a steady state level, for a duration of the read operation, and transition back to 0 V at t10. Vsgd_sel and Vsgs_sel will enter a conductive state shortly after t1.

In FIG. 6C, waveform 604 represents Vcg_unsel, also referred to as a pass voltage Vpass, which transitions from 0 V at t1 to a steady state level of Vread_pass at t5, in one continuous increase, remains at Vread_pass from t5-t10, and transitions back to 0 V at t10. Vcg_unsel is the voltage applied to the control gate of unselected memory cells. Vcg_sel is the voltage applied to the control gate of selected memory cells. Vread_pass is sufficiently high to provide all unselected memory cells in a conductive state.

In FIG. 6D1, the waveforms represent options for Vcg_sel. Vcg_sel transitions from 0 V to Vread_pass and back to 0 V, in a boosting phase of a read operation, and then to Vcgr and back to 0 V, in a sensing phase of a read operation. For example, waveform 606 depicts Vcg_sel transitioning up from 0 V at t1, reaching Vread_pass at t5, and transitioning back to 0 V after t5. Raising Vcg_sel above the Vth of the selected memory cells causes the selected memory cells to be in a conductive state. At t6, Vcg_sel transitions from 0 V to one of the Vcgr read levels, such as VcgrA 612, VcgrB 610 or VcgrC 608, and remains at that level until t10.

In FIG. 6E, waveforms 622 and 624 represent Vbl. Vbl transitions from 0 V to Vbl0 (an elevated non-zero level which is suitable for sensing) at t1, and either remains at Vbl0 or decays during sensing from t8-t10, and transitions back to 0 V at t10. In one approach, the voltage in the channel of the selected NAND string, Vchannel_sel, will be set to Vbl, when Vsgd_sel and Vsg_sel are conductive.

T9 is a sense time (Tsense) at which sensing circuitry associated with each select NAND string determines a conductive state of the NAND string. Since Vcg_unsel causes the unselected memory cells in a NAND string to be in a conductive state, the conductive state of the NAND string as determined by sensing indicates the conductive state of the selected memory cell. With Vcgr applied to the selected memory cell, the conductive state of the NAND string indicates whether the Vth of the selected memory cell exceeds Vcgr (string conductive→the Vth of the memory cell exceeds Vcgr). In one approach, Vbl decays below a level Vsense at t9 when the string is conductive, as represented by waveform 624 and this decay is sensed by the sensing circuitry. Waveform 622 represents the case where the string is not conductive, in which case Vbl does not decay below Vsense.

In FIG. 6A1, from t1-t2, the SGD and SGS select gates of the unselected NAND strings are in a non-conductive state, as mentioned, so that the channel is isolated. As a result, when Vcg_unsel (waveform 604) is ramped up, Vchannel_unsel, the channel voltage of an unselected NAND string, (waveform 628) increases due to capacitive coupling. From t2-t4, the SGD and SGS select gates for the unselected NAND strings are in a conductive state. As a result, the drain end of the channel will communicate with the bit line which is at a level, e.g., between 0 V and Vbl0, and the source end of the channel will communicate with the source line which is at, e.g., 0 V. Vchannel provides a representative overall voltage of the channel. Its exact level may be difficult to predict, but it will be governed by the driving voltages at the opposing ends. As an example, in FIG. 6F, Vchannel 628 increases from t1-t2 at a relatively high rate due to the relatively high rate of Vcg_unsel from t1-t2. The increase in Vchannel is interrupted from t2-t4 because the channel is no longer isolated due to the SGD and SGS select gates becoming conductive.

or t1-t3 the channel is isolated again due to the SGD and SGS select gates becoming non-conductive. Vchannel increases again from t4-t5 but at a relatively low rate due to the relatively low rate of Vcg_unsel from t4-t5. By making the SGD and SGS select gates of an unselected NAND string temporarily and briefly conductive during the increase of Vcg_unsel, capacitive coupling from Vcg_sel is temporarily interrupted. After t4, the SGD and SGS select gates are in a non-conductive state. As Vcg_unsel (waveform 604) continues to ramp up from t4-t5, Vchannel (waveform 628) increases due to capacitive coupling from Vcg_unsel, reaching a level referred to as Vch0. When Vcg_unsel is steady at Vread_pass from t5-t10, Vchannel (waveform 628) does not increase since there is no capacitive coupling from the steady voltage.

Waveform 626 in FIG. 6F represents a comparison case for Vchannel in which no spiking of the SGD or SGS select gates is used, so that the full measure of channel boosting (at a level referred to as Vch1) is realized. By reducing the channel boosting to the optimum level referred to as Vch0 (Vbl0<Vch0<Vch1), both normal and weak-erase type of read disturb can be optimally repressed. Although Vch0 is not directly controllable, this approach allows Vchannel to reach a level other than Vbl0.

Regarding Vcg_sel, an unselected memory cell (in an unselected sub-block) which is connected to the same word line or word line portion (e.g., is at the same level) as a selected memory cell in a selected sub-block, will transition to a conductive state since Vread_pass or a similar level exceeds the Vth of the highest state memory cell. As a result, the channel of the unselected NAND string is not cutoff at the unselected memory cell which is connected to the same word line or word line portion as a selected memory cell, and the temporary conductive state of the SGD select gate, for instance, can achieve the desired goal of allowing the channel to communicate with the bit line. The channel of the unselected NAND string similarly is not cutoff at the other unselected memory cells (which are not connected to the same word line or word line portion as a selected memory cell, and which are connected to the same word line or word line portion as an unselected memory cell in a selected NAND string).

FIG. 5C depicts another embodiment of the read operation of FIG. 5A. This approach involves: a SGD spike+making the selected memory cell conductive+a one-step increase in Vcg_unsel. This approach is described further in connection with FIGS. 6A2, B, C, D1, E and F.

In this embodiment, a spiked voltage is applied to the SGD select gates but not the SGS select gates. Vsgd_unsel transitions from 0 V to V1 and back to 0 V, as discussed in connection with waveform 600 (see FIG. 6A2). Vsgs_unsel remains at 0 V, as depicted by waveform 605 in FIG. 6A2. Vsgd_sel and Vsgs_sel transition from 0 V to V2, remain at V2 for a duration of the read operation, and transition back to 0 V at t10, as discussed in connection with waveform 602 in FIG. 6B.

Vcg_unsel transitions from 0 V to Vread_pass and back to 0 V, as discussed in connection with waveform 604 in FIG. 6C. Vcg_sel transitions from 0 V to Vread_pass and back to 0 V, and then to Vcgr and back to 0 V, as discussed in connection with FIG. 6D1.

Vbl transitions from 0 V to Vbl0 and back to 0 V, as discussed in connection with FIG. 6E.

When the SGD select gate is spiked but not the SGS select gate, it is expected that Vchannel will be roughly similar to the waveform 628 of FIG. 6F. In this case, the source end of the NAND string is floating and the drain end is in communication with the bit line, so that Vchannel will tend to transition toward Vbl from t2-t4.

FIG. 5D depicts another embodiment of the read operation of FIG. 5A. This approach involves: a SGS spike+making the selected memory cell conductive+a one-step increase in Vcg_unsel. This approach is described further in connection with FIGS. 6A3, B, C, D1, E and F. In this embodiment, a spiked voltage is applied to the SGS select gates but not the SGD select gates. Vsgs_unsel transitions from 0 V to V1 and back to 0 V, as discussed in connection with waveform 600 in FIG. 6A3. Vsgd_unsel remains at 0 V, as depicted by waveform 605 in FIG. 6A3. Vsgd_sel and Vsgs_sel transition from 0 V to V2, remain at V2 for a duration of the read operation, and transition back to 0 V at t10, as discussed in connection with waveform 602 in FIG. 6B.

Vcg_unsel transitions from 0 V to Vread_pass and back to 0 V, as discussed in connection with waveform 604 in FIG. 6C. Vcg_sel transitions from 0 V to Vread_pass and back to 0 V, and then to Vcgr and back to 0 V, as discussed in connection with FIG. 6D1.

Vbl transitions from 0 V to Vbl0 and back to 0 V, as discussed in connection with FIG. 6E.

When the SGS select gate is spiked but not the SGD select gate, it is expected that Vchannel will be roughly similar to the waveform 628 of FIG. 6F, although Vchannel may drop slightly from t2-t4. In this case, the drain end of the NAND string is floating and the source end is in communication with the source line, so that Vchannel will tend to transition toward Vsl=0 V from t2-t4.

FIG. 5E depicts another embodiment of the read operation of FIG. 5A. This approach involves: a SGD and SGS spike+ allowing the selected memory cell to be non-conductive+a one-step increase in Vcg_unsel. This approach is described further in connection with FIGS. 6A1, B, C, D2, E and F.

Vsgd_unsel and Vsgs_unsel transition from 0 V to V1 and back to 0 V, as discussed in connection with waveform 600 in FIG. 6A1. Vsgd_sel and Vsgs_sel transition from 0 V to V2, remain at V2 for a duration of the read operation, and transition back to 0 V at t10, as discussed in connection with waveform 602 in FIG. 6B.

Vcg_unsel transitions from 0 V to Vread_pass and back to 0 V, as discussed in connection with waveform 604 in FIG. 6C. Vcg_sel remains at 0 V from t048, as depicted by waveform 611 in FIG. 6D2, instead of transitioning higher as depicted by waveform 606 in FIG. 6D1. With Vcg_sel at 0 V, most or all of the selected memory cells will be in a non-conductive state since their threshold voltages will exceed Vcg_sel. Some of the E-state memory cells having a Vth<0 V could be conductive with Vcg_sel at 0 V.

Vcg_sel transitions from 0 V to Vcgr and back to 0 V, as depicted by the waveforms 608, 610 and 612 in FIG. 6D2.

Vbl transitions from 0 V to Vbl0 and back to 0 V, as discussed in connection with FIG. 6E.

Since Vcg_sel (e.g., 0 V, waveform 611) does not exceed the Vth of most of the memory cells, the unselected memory cells which are connected to the same word line or word line portion (e.g., on the same level as) as a selected memory cell will be in a non-conductive state, cutting off the channels of the unselected NAND strings at these unselected memory cells. Each channel may be divided into two portions, a drain side portion communicating with the drain end and a source side portion communicating with the source end. When the SGD and SGS select gates are made conductive from t2-t4, the drain side portion of the channel will communicate with a bit line, driving the voltage toward Vbl, and the source side portion of the channel will communicate with a source line, driving the voltage toward Vsl, e.g., discharging the source side portion of the channel.

FIG. 5F depicts another embodiment of the read operation of FIG. 5A. This approach involves raising and stabilizing (rather than spiking) SGD+making the selected memory cell conductive+a one-step increase in Vcg_unsel. This approach is described further in connection with FIGS. 7A, B, C1, D, E and F1. Instead of spiking Vsgd_unsel, in which Vsgd_unsel may not reach a steady state level, this approach allows Vsgd_unsel to reach and stabilize at V3, as depicted by waveform 700 in FIG. 7A. In particular, Vsgd_unsel rises up from 0 V starting at t1, exceeds Vth at t2, reaches V3, remains at V3 until t4, and returns back to 0 V after t4. Vsgs_unsel remains at 0 V from t0410, as depicted by waveform 702 in FIG. 7A.

In FIG. 7B, waveform 704 indicates that Vsgd_sel and Vsgs_sel transition from 0 V to V2 at t1, remain at V2 for a duration of the read operation, until t10, and transition back to 0 V after t10.

In FIG. 7C1, waveform 706 indicates that Vcg_unsel transitions from 0 V at t1 to Vread_pass at t3, remains at Vread_pass from t3410, and returns back to 0 V after t10.

In FIG. 7D, waveform 708 indicates that Vcg_sel transitions from 0 V at t1 to Vread_pass at t1, remains at Vread_pass until t4, and returns back to 0 V after t4. Vcg_sel then transitions from 0 V at t6 to one of the Vcgr levels 710, 712 and 714, remains at the Vcgr level from t7410, and returns back to 0 V after t10. Tsense is at t9.

In FIG. 7E, waveforms 716 and 718 indicate that Vbl transitions from 0 V at t1 to Vbl0, and remains at Vbl0 until t8. Waveform 716 represents the case where the selected NAND string is non-conductive and waveform 718 represents the case where the selected NAND string is conductive. This approach provides certainty in the level of Vchannel (FIG. 7F1) since it is set to Vbl0, a controllable parameter. In one approach, the voltage in the channel of the selected NAND string, Vchannel_sel, will be set to Vbl0, when Vsgd_sel and Vsg_sel are conductive.

In FIG. 7F1, waveform 720 represents Vchannel. Vchannel increases from t1-t2 at a relatively high rate due to the relatively high rate of increase in Vcg_unsel from t1-t2. The increase in Vchannel is interrupted at t2, after which Vchannel stabilizes at Vbl0 since the bit line communicates with the channel via the conductive SGD select gate from t2-t5. After t5, the SGD select gate transitions back to the non-conductive state, so that Vchannel is not set to Vbl0, but may remain about at Vbl0.

FIG. 5G depicts another embodiment of the read operation of FIG. 5A. This approach involves raising and stabilizing (rather than spiking) SGD+making the selected memory cell conductive+a two-step increase in Vcg_unsel. This approach is described further in connection with FIGS. 7A, B, C2, D, E and F2.

Vsgd_unsel transitions from 0 V to V3, remains at V3, and returns back to 0 V after t4, as discussed in connection with waveform 700 in FIG. 7A. Vsgs_unsel remains at 0 V from t0-t10, as discussed in connection with waveform 702 in FIG. 7A.

Vsgd_sel and Vsgs_sel transition from 0 V to V3 at t1, remain at V3 for a duration of the read operation, and transition back to 0 V at t10, as discussed in connection with waveform 704 in FIG. 7B.

Vcg_unsel transitions from 0 V to Vread_pass1 starting at t1, in a first step, remains at Vread_pass1 until t5.1, transitions from Vread_pass1 to Vread_pass2 (>Vread_pass1) starting at t5.1, in a second step, remains at Vread_pass2 until t10, and returns back to 0 V after t10, as depicted by waveform 706 in FIG. 7C2. Thus, Vcg_unsel transitions higher in two-steps. The idea could be extended to additional steps as well.

Vcg_sel transitions from 0 V to Vread_pass and back to 0 V, and then to Vcgr and back to 0 V, as discussed in connection with FIG. 7D.

Vbl transitions from 0 V to Vbl0 and back to 0 V, as discussed in connection with FIG. 7E.

In FIG. 7F2, Vchannel (waveform 722) increases from t1-t2 at a relatively high rate due to the relatively high rate of increase of Vcg_unsel (waveform 706) from t1-t2. The increase in Vchannel is interrupted at t2. Vchannel stabilizes at Vbl0 from about t2-t5 since the bit line at Vbl0 communicates with the channel via the conductive SGD select gate. From t5-t5.1, the SGD select gate becomes non-conductive again, so that Vchannel may remain about at Vbl0 but is not driven to that level. Vchannel increases again from t5.1-t5.2 at due to the increase in Vcg_unsel (waveform 706) from t5.1-t5.2. Vchannel stabilizes at a level referred to as Vch2 from t5.2-t10 since Vcg_unsel is stable. Vchannel increases due to capacitive coupling from Vcg_unsel from t1-t2 and t5.1-t5.2. Although Vch2 is not directly controllable, this approach is more controllable than the approach of FIG. 6F, for instance, because this approach drives Vchannel to a controllable level (e.g., Vbl0) for a first increment of the channel boosting. The second increment of the channel boosting, Vch2-Vbl0, is typically smaller than the increment of Vch1-0 V in FIG. 6F. However, there is a time and power consumption penalty compared to the approach of FIG. 6F.

Note that Vchannel is generally set to Vbl for selected NAND strings.

Each of the embodiments of FIGS. 5B-5G involves a method for performing a read operation in a 3D stacked non-volatile memory device comprising multiple levels (e.g., L0-L6 or L0-L5 in FIGS. 3 and 9, respectively) of memory cells, where the read operation is performed on selected memory cells in a selected level (e.g., L3 in the examples of FIGS. 3 and 9) of the multiple levels. The method includes increasing a pass voltage (Vcg_unsel) from an initial level (e.g., 0 V) to at least a first elevated level (Vread_pass), for memory cells in unselected levels of the multiple levels. The unselected levels could be (e.g., L0-L2 and L4-L6 or L0-L2, L4 and L5 in FIGS. 3 and 9, respectively). The memory cells in the multiple levels of memory cells are arranged in at least one selected string of memory cells (e.g., NSA0 in FIG. 3 and NSB0 in FIG. 9) and at least one unselected string of memory cells (e.g., NSA1-NSA5 in FIG. 3 and NSB1-NSB5 in FIG. 9). The at least one selected string of memory cells includes at least one of the selected memory cells. The at least one selected string of memory cells comprises a drain end (278, 801) with an associated first select gate (SGD0 310, 900) and a source end (302, 803) with an associated second select gate (SGS0 312, 906), and includes memory cells (MC0,0-MC6,0; MC0,0-MC5,0) in each of the multiple levels. The at least one unselected string of memory cells does not include any of the selected memory cells, comprises a drain end (306, 802) with an associated third select gate (SGD1 316, 902) and a source end (304, 816) with an associated fourth select gate (SGS1 314, 908), and includes memory cells (MC0,1-MC6,1; MC0,1-MC5,1) in each of the multiple levels.

The method includes, during the increasing (e.g., throughout or at least in part of t1-t5 in FIG. 6C or t1-t3 in FIG. 7C1), providing the first select gate in a conductive state (e.g., increasing Vsgd_sel above V1); while providing the first select gate in the conductive state, transitioning at least one of the third and fourth select gates between a non-conductive state and the conductive state (this could be a transition from non-conductive to conductive such as at t2 in FIG. 6A1 or FIG. 7A, or a transition from conductive to non-conductive such as at t4 in FIG. 6A1 or t5 in FIG. 7A); and applying a control gate read voltage (e.g., VcgrA, VcgrB or VcgrC)_to the selected memory cells, and sensing whether a threshold voltage of the at least one of the selected memory cells is above the control gate read voltage by sensing whether the at least one selected string of memory cells is in a conductive state.

FIGS. 6A1 to 6D2 have a common time axis but the time increments are not necessarily equally spaced and the figures are not necessarily to scale. FIGS. 7A to 7F2 have a common time axis (different than the time axis of FIGS. 6A1 to 6F). The time increments are not necessarily equally spaced and the figures are not necessarily to scale. Vsl=0 V for the examples of FIGS. 6A1-6F and 7A-7F2. In FIGS. 6A1-6F, the boosting portion of the read operation is from t1-t6, and the sensing portion is from t8-t11. T6-t8 is a transition period between boosting and sensing. In FIGS. 7A, 7B, 7C1, 7D, 7E and 7F1, the boosting portion of the read operation is from t1-t5, and the sensing portion is from t9-t12. In FIGS. 7C2 and 7F2, the boosting portion of the read operation is from t1-t8, and the sensing portion is from t9-t12.

Figure 8A:
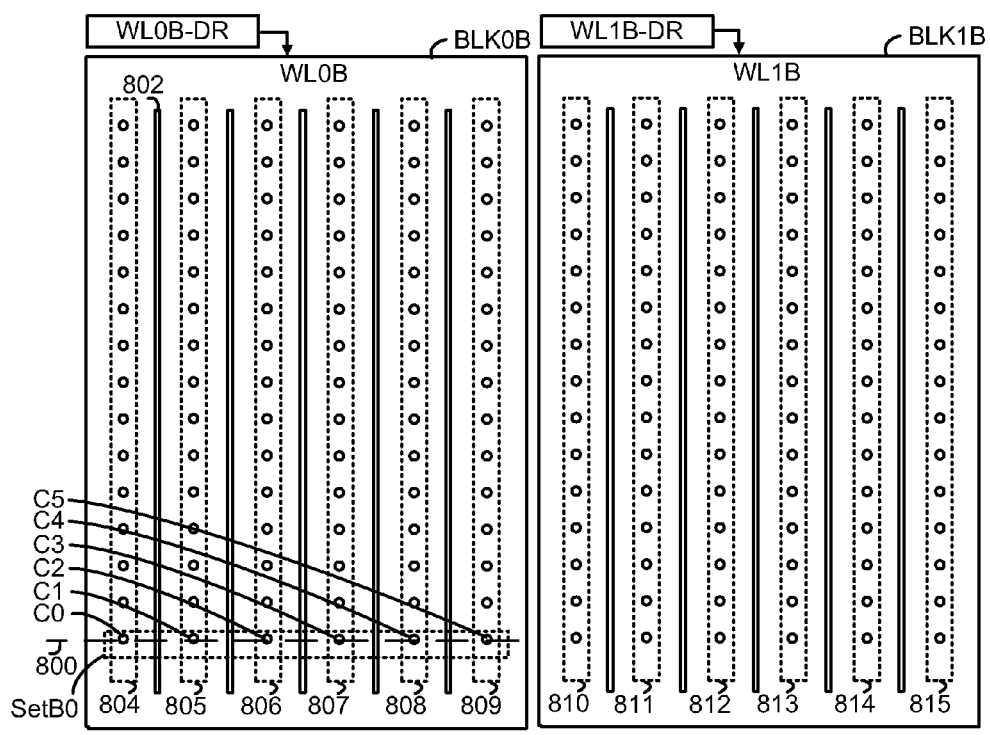
FIG. 8A depicts a top view of word line layers of a 3D non-volatile memory device having straight NAND strings, consistent with FIGS. 1E and 1F, showing associated drivers.

FIG. 8A depicts a top view of word line layers of a 3D non-volatile memory device having straight NAND strings, consistent with FIGS. 1E and 1F, showing associated drivers. In this configuration, a NAND string has only one column, and the source-side select gate is on the bottom of the column instead of on the top, as in a U-shaped NAND string. Moreover, a given level of a block has one word line layer which is connected to each of the memory cells of the layer. For example, BLK0B has word line layer WL0B, driven by WL0B-DR, and BLK1B has word line layer WL1B, driven by WLB1-DR. A number of slits, such as example slit 802, can also be used. These insulation-filled slits are used in the fabrication process to provide structural support for the stack when undoped polysilicon layers are removed by a wet etch and a dielectric is deposited to form the alternating dielectric layers.

Figure 8B:
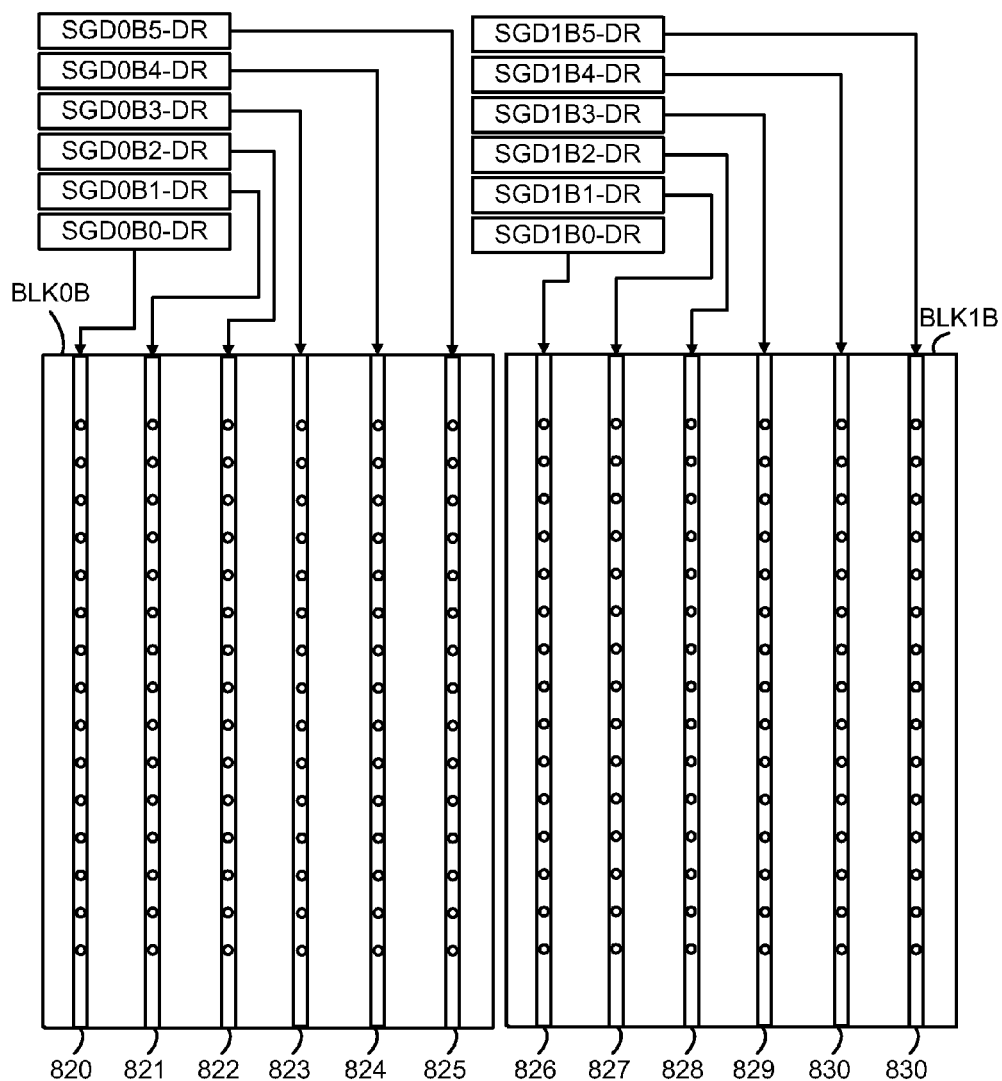
FIG. 8B depicts a top view of a select gate layer of the 3D non-volatile memory device of FIG. 8A, showing drain-side select gate lines and associated drivers.
Figure 8C:
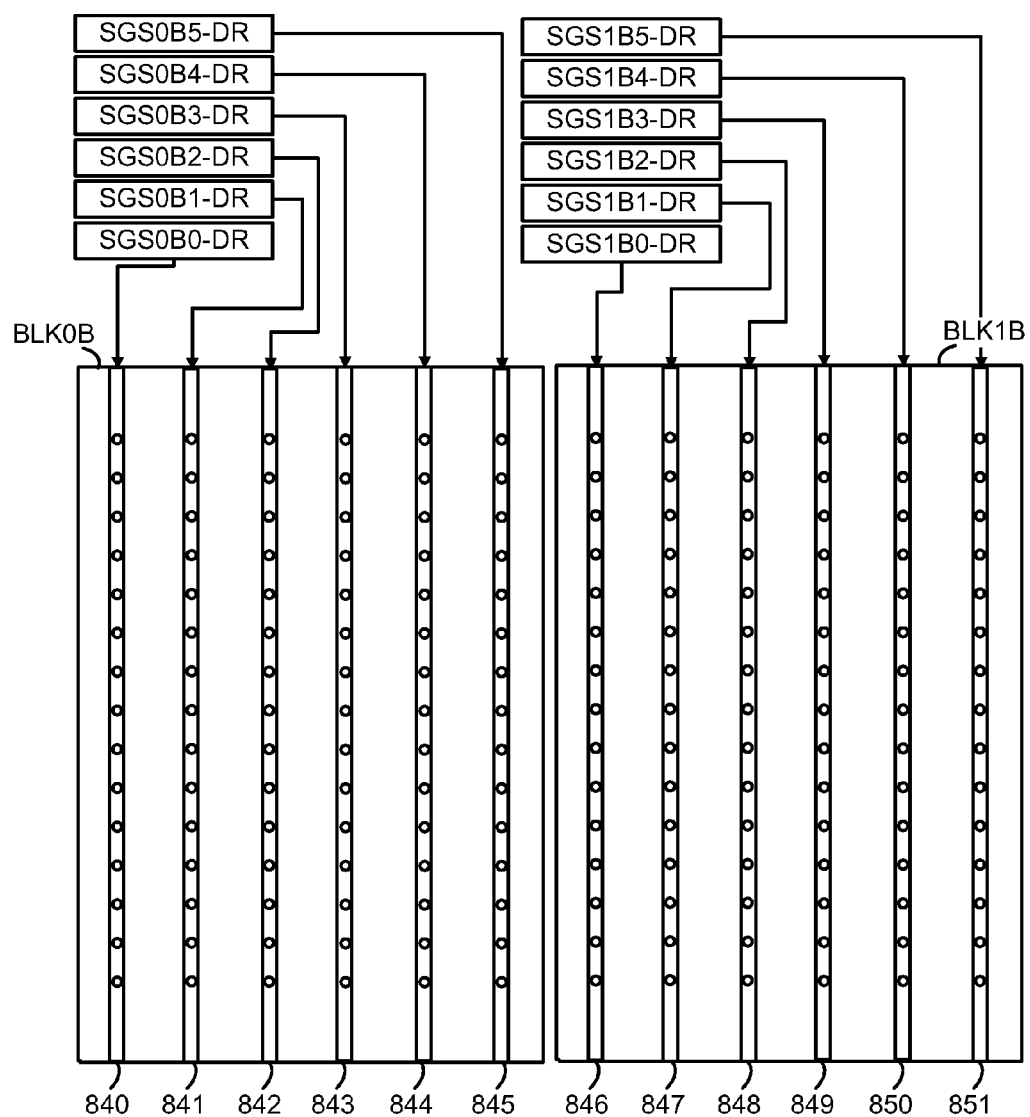
FIG. 8C depicts a top view of a select gate layer of the 3D non-volatile memory device of FIG. 8A, showing source-side select gate lines and associated drivers.
Figure 8D:
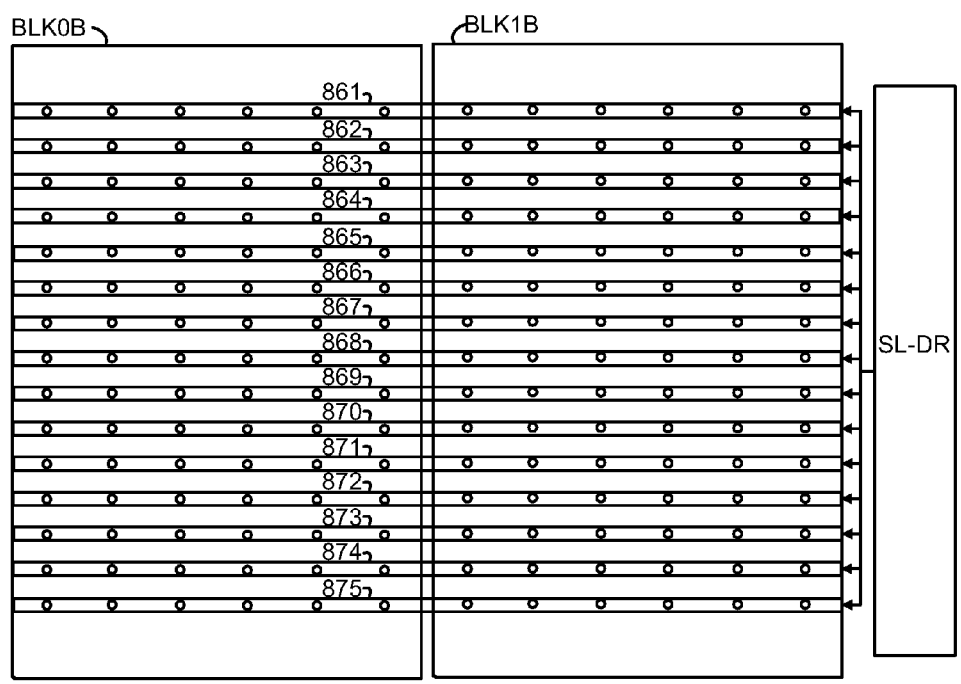
FIG. 8D depicts a top view of a source line layer of the 3D non-volatile memory device of FIG. 8A, showing source lines and associated drivers.
Figure 8F:
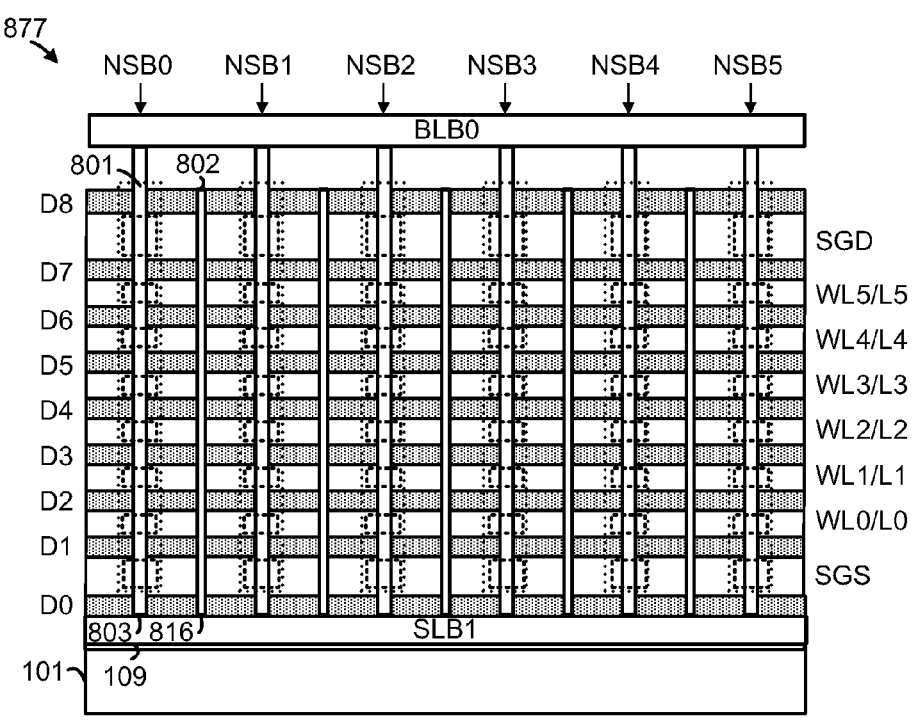
FIG. 8F depicts a cross-sectional view of a block of the 3D non-volatile memory device of FIG. 8A, along line 800 of setB0 of NAND strings FIG. 8A.

A dashed line 800 extends through columns C0 to C6, shown in cross-section in FIG. 8F. Each block can include sub-blocks of columns of memory cells, such as sub-blocks 804 to 809 in BLK0B and sub-blocks 810 to 815 in BLK1B.

FIG. 8B depicts a top view of a select gate layer of the 3D non-volatile memory device of FIG. 8A, showing drain-side select gate lines and associated drivers. For example, this can represent layer SGD of FIG. 8F. A separate drain-side select gate line, e.g., a conductive line or path, may be associated with each row of columns of memory cells. For example, BLK0B includes select gate lines 820 to 825, which are driven by select gate drivers SGD0-DR to SGD5-DR, respectively. BLK1B includes select gate lines 826 to 831, which are driven by select gate drivers SGD6-DR to SGD11-DR, respectively. The select gate drivers provide signals such as voltage waveforms to the select gate lines.

FIG. 8C depicts a top view of a select gate layer of the 3D non-volatile memory device of FIG. 8A, showing source-side select gate lines and associated drivers. For example, this can represent layer SGS of FIG. 8F. A separate source-side select gate line, e.g., a conductive line or path, is associated with each row of columns of memory cells. For example, BLK0B includes select gate lines 840 to 846, which are driven by select gate drivers SGS0B0-DR to SGS05B-DR, respectively. BLK1B includes select gate lines 846 to 851, which are driven by select gate drivers SGS1B0-DR to SGS1B5-DR, respectively. The select gate drivers provide signals such as voltage waveforms to the select gate lines.

FIG. 8D depicts a top view of a source line layer of the 3D non-volatile memory device of FIG. 8A, showing source lines and associated drivers. For example, this can represent layer SL of FIG. 8F. A source line, e.g., a conductive line or path, is associated with a set of columns of memory cells which extend in a horizontal line in the figure. A source line extends across multiple blocks which are adjacent laterally of one another. A source line is connected to a source-side end of a NAND string, e.g., to a vertical channel or body of the NAND string. For example, source lines 861 to 875 are driven by source line driver SL-DR. The source line driver provides a signal such as a voltage waveform to the source-side ends of the NAND strings.

FIG. 8E depicts a top view of a bit line layer of the 3D non-volatile memory device of FIG. 8A, showing bit lines and associated drivers for BLK0B and BLK1B. For example, this can represent layer BL of FIG. 8F. A bit line, e.g., a conductive line or path, is associated with a set of columns of memory cells which extend in a horizontal line in the figure. A bit line extends across multiple blocks which are adjacent laterally of one another. A bit line is connected to a drain-side end of a NAND string, e.g., to a vertical channel or body of the NAND string. For example, bit lines 881 to 895 are driven by bit line drivers BL0-DR to BL14-DR, respectively. The bit line drivers provide signals such as voltage waveforms to the drain-side ends of the NAND strings.

FIG. 8F depicts a cross-sectional view of a block of the 3D non-volatile memory device of FIG. 8A, along line 800 of setB0 of NAND strings FIG. 8A. Columns of memory cells corresponding to NAND strings NSB0 to NSB5, respectively, are depicted in the multi-layer stack. The stack 877 includes a substrate 101, an insulating film 109 on the substrate, and a portion of a source line 863. Recall that the additional straight NAND strings in a sub-block extend in front of and in back of the NAND strings depicted in the cross-section, e.g., along the x-axis. The NAND strings NSB0 to NSB5 are each in a different sub-block, but are in a common set of NAND strings (SetB0). NSB0 has a source end 803 and a drain end 801. The slit 802 from FIG. 8A is also depicted with other slits. A portion of the bit line BLB0 is also depicted. Dashed lines depict memory cells and select gates, as discussed further below. WL0-WL6 represent word line layers or word line layer portions which are at levels L0-L6, respectively.

FIG. 9 depicts an arrangement of memory cells in an example set of NAND strings such as SetB0 in FIG. 8F. NAND strings NSB0 to NSB5 are depicted. A similar notation as used above is provided. In an example read process, the memory cell which is selected to be read is MC3,0. L3 is thus a selected level of the block. MC3,0 is in a selected sub-block 804 (FIG. 1F) comprising NSB0 and the NAND strings behind it. The other memory cells of L3 (i.e., MC3,1-MCS3,5) are in five unselected sub-blocks comprising NSB1-NSB5 and the NAND strings 180-183 behind them. Also, the other memory cells of the other levels (L0-L2, L4 and L5) are unselected.

With NSB0 being part of the selected sub-block 804 (FIG. 1F) in this example, the memory cells in the multiple levels of memory cells of the block are arranged in at least one selected string of memory cells (NSB0) and at least one unselected string of memory cells (NSB1-NSB5). The at least one selected string of memory cells includes at least one selected memory cell (MC3,0 904). The at least one selected string of memory cells comprises a drain end 801 (FIG. 8F) with an associated first select gate (SGD0 900) and a source end 803 (FIG. 8F) with an associated second select gate (SGS0 906), and includes memory cells (MC0,0-MC5,0) in each of the multiple levels (L0-L5). The at least one unselected string of memory cells (NSA1) does not include any of the selected memory cells, and comprises a drain end 802 with an associated third select gate (SGD1 902) and a source end 816 with an associated fourth select gate (SGS1 908), and includes memory cells (MC0,1-MC5,1) in each of the multiple levels (L0-L5).

The at least one selected string of memory cells (NSB0) is in a selected sub-block 804 of a block BLK0B (FIG. 1F) of the 3D stacked non-volatile memory device. The selected sub-block includes a plurality of selected strings of memory cells NSB0 and 180-183 (FIG. 1F). The at least one unselected string of memory cells (NSB1-NSB5) is in an unselected sub-block (805-809) of the block. The unselected sub-block includes a plurality of unselected strings of memory cells (NSB1-NSB5 and the NAND strings behind them).

Accordingly, it can be seen that, in one embodiment, a method is provided for performing a read operation in a 3D stacked non-volatile memory device comprising multiple levels of memory cells, where the read operation is performed on selected memory cells in a selected level of the multiple levels. The method includes: (a) increasing a pass voltage (Vcg_unsel) from an initial level (e.g., 0 V) to at least a first elevated level (Vread_pass), for memory cells in unselected levels of the multiple levels, the memory cells in the multiple levels of memory cells are arranged in at least one selected string of memory cells and at least one unselected string of memory cells, the at least one selected string of memory cells includes at least one of the selected memory cells, comprises a drain end with an associated first select gate (SGD) and a source end with an associated second select gate (SGS), and includes memory cells in each of the multiple levels, and the at least one unselected string of memory cells does not include any of the selected memory cells, comprises a drain end with an associated third select gate (SGD) and a source end with an associated fourth select gate (SGS), and includes memory cells in each of the multiple levels; (b) during the increasing, providing the first select gate in a conductive state; (c) while providing the first select gate in the conductive state, transitioning at least one of the third and fourth select gates between a non-conductive state and the conductive state; and (d) applying a control gate read voltage to the selected memory cells, and sensing whether a threshold voltage of the at least one of the selected memory cells is above the control gate read voltage by sensing whether the at least one selected string of memory cells is in a conductive state.

In another embodiment, a 3D stacked non-volatile memory device comprises multiple levels of memory cells formed on a substrate, the memory cells in the multiple levels of memory cells are arranged in at least one selected string of memory cells and at least one unselected string of memory cells, where (a) the at least one selected string of memory cells includes at least one of the selected memory cells, and comprises a drain end with an associated first select gate (SGD) and a source end with an associated second select gate (SGS), and (b) the at least one unselected string of memory cells does not include any of the selected memory cells, and comprises a drain end with an associated third select gate (SGD) and a source end with an associated fourth select gate (SGS). The 3D stacked non-volatile memory device further comprises at least one control circuit. The at least one control circuit, to perform a read operation on selected memory cells in a selected level of the multiple levels: (c) increases a pass voltage (Vcg_unsel) from an initial level (e.g., 0 V) to at least a first elevated level (Vread_pass), for memory cells in unselected levels of the multiple levels, (d) during the increase, provides the first select gate in a conductive state, (e) while the first select gate is provided in the conductive state, transitions at least one of the third and fourth select gates between a non-conductive state and the conductive state, (f) applies a control gate read voltage to the selected memory cells, and (g) with the control gate read voltage applied, senses whether a threshold voltage of the at least one of the selected memory cells is above the control gate read voltage.

In another embodiment, a method is provided for performing a read operation in a 3D stacked non-volatile memory device comprising multiple levels of memory cells. The read operation is performed on selected memory cells in a selected level of the multiple levels. The method comprises: (a) boosting a channel of at least one unselected string of memory cells, the memory cells in the multiple levels of memory cells are arranged in at least one selected string of memory cells and the at least one unselected string of memory cells, the at least one selected string of memory cells includes at least one of the selected memory cells, comprises a drain end with an associated first select gate (SGD) and a source end with an associated second select gate (SGS), and the at least one unselected string of memory cells does not include any of the selected memory cells, and comprises a drain end with an associated third select gate (SGD) and a source end with an associated fourth select gate (SGS), the boosting the channel includes increasing a pass voltage (Vcg_unsel) from an initial level (e.g., 0 V) to at least a first elevated level (Vread_pass), for memory cells in unselected levels of the multiple levels; (b) during the increasing of the pass voltage, before the pass voltage reaches the first elevated level, interrupting the boosting by raising a voltage of the first select gate to cause the first select gate to transition to a conductive state; and (c) with the channel at a boosted level caused by the boosting, and the pass voltage (Vcg_unsel) at the at least the first elevated level: applying a control gate read voltage to the selected memory cells, and sensing whether a threshold voltage of the at least one of the selected memory cells is above the control gate read voltage.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for reading, the method comprising:
performing a read operation for a selected memory cell in a first plurality of memory cells, the first plurality of memory cells are formed above a substrate in multiple physical levels of memory cells in a three-dimensional non-volatile memory, and the performing a read operation comprises applying a control gate voltage to a selected word line of the three-dimensional non-volatile memory which is coupled to the selected memory cell while providing a drain-side select gate of the first plurality of memory cells in a conductive state and while sensing a threshold voltage of the selected memory cell; and controlling a boosting level of a channel of an active area of a second plurality of memory cells during the read operation, the second plurality of memory cells are formed above the substrate in the multiple physical levels of memory cells in the three-dimensional non-volatile memory, the active area comprises a pillar which extends vertically in the three-dimensional non-volatile memory, the controlling comprises allowing boosting of the channel followed by interrupting boosting of the channel, the allowing boosting of the channel comprise applying an increasing pass voltage to an unselected word line of the three-dimensional non-volatile memory while providing select gates of the second plurality of memory cells in a non-conductive state, and the interrupting boosting of the channel comprises transitioning at least one of the select gates of the second plurality of memory cells from the non-conductive state to the conductive state, the performing of the read operation and the controlling of the boosting level are performed by circuitry which is associated with operation of the first plurality of memory cells and the second plurality of memory cells.

2. The method of claim 1, wherein:
the controlling comprises transitioning the at least one of the select gates of the second plurality of memory cells back from the conductive state to the non-conductive state.

3. The method of claim 2, further comprising:
further increasing the pass voltage after the transitioning the at least one of the select gates of the second plurality of memory cells back from the conductive state to the non-conductive state.

4. The method of claim 2, wherein:
the transitioning the at least one of the select gates of the second plurality of memory cells from the non-conductive state to the conductive state comprises increasing a voltage of the at least one of the select gates of the second plurality of memory cells.

5. The method of claim 4, further comprising:
transitioning the at least one of the select gates of the second plurality of memory cells from the conductive state back to the non-conductive state by decreasing the voltage of the at least one of the select gates of the second plurality of memory cells.

6. The method of claim 5, wherein:
the voltage of the at least one of the select gates of the second plurality of memory cells has a spike shape.

7. The method of claim 5, wherein:
the voltage of the at least one of the select gates of the second plurality of memory cells reaches a steady state level after the increasing the voltage and before the decreasing the voltage.

8. The method of claim 1, wherein:
the select gates of the second plurality of memory cells comprises a drain-side select gate and a source-side select gate; and
the transitioning comprises transitioning both the drain-side and source-side select gates of the second plurality of memory cells from the non-conductive state to the conductive state.

9. The method of claim 8, wherein:
the controlling comprises transitioning both the drain-side and source-side select gates of the second plurality of memory cells back from the conductive state to the non-conductive state.

10. The method of claim 1, wherein:
the performing the read operation comprises providing a source-side select gate of the first plurality of memory cells in the conductive state.

11. The method of claim 1, wherein:
the controlling comprise applying the increasing pass voltage to a plurality of unselected word lines of the three-dimensional non-volatile memory.

12. The method of claim 1, further comprising:
during the transitioning, applying a voltage to the selected word line which is sufficiently high to render the selected memory cell in the conductive state.

13. The method of claim 12, further comprising:
after the transitioning and before the sensing, removing the voltage from the selected word line which is sufficiently high to render the selected memory cell in the conductive state.

14. The method of claim 1, further comprising:
while providing the drain-side select gate of the first plurality of memory cells in the conductive state, applying, via a common bit line, a non-zero voltage to the drain-side select gate of the first plurality of memory cells and to the drain-side select gate of the second plurality of memory cells.

15. The method of claim 1, wherein:
the circuitry is within the substrate.

16. The method of claim 1, wherein:
the circuitry is above the substrate.

17. The method of claim 1, wherein:
the at least one of the select gates of the second plurality of memory cells comprises a drain-side select gate of the second plurality of memory cells.

18. The method of claim 1, wherein:
the at least one of the select gates of the second plurality of memory cells comprises a source-side select gate of the second plurality of memory cells.

19. A non-volatile memory device, comprising:
a substrate;
a first plurality of memory cells, the first plurality of memory cells are formed above the substrate in multiple physical levels of memory cells in a three-dimensional non-volatile memory, the first plurality of memory cells comprise an active area, the active area of the first plurality of memory cells comprises a pillar which extends vertically in the three-dimensional non-volatile memory, the first plurality of memory cells comprise a selected memory cell in a selected level of the multiple physical levels, and the first plurality of memory cells comprising a drain-side select gate and a source-side select gate;
a second plurality of memory cells, the second plurality of memory cells are formed above the substrate in the multiple physical levels of memory cells in the three-dimensional non-volatile memory, the second plurality of memory cells comprise an active area, the active area of the second plurality of memory cells comprises a pillar which extends vertically in the three-dimensional non-volatile memory, the second plurality of memory cells comprise unselected memory cells in the multiple physical levels, and the second plurality of memory cells comprise a drain-side select gate and a source-side select gate; and
circuitry in communication with the plurality of memory cells, the circuitry provides an increase during a period of time in a pass voltage for memory cells in an unselected level of the multiple physical levels, and during the period of time, provides the drain-side select gate of the first plurality of memory cells in a conductive state and transitions at least one of the select gates of the second plurality of memory cells from a non-conductive state to the conductive state and back to the non-conductive state, and after the period of time, applies a control gate voltage to the selected memory cell and senses a threshold voltage of the selected memory cell.

20. The non-volatile memory device of claim 19, wherein: during the period of time, the circuitry applies a voltage to the selected level which is sufficiently high to render the selected memory cell in the conductive state.

21. The non-volatile memory device of claim 20, wherein: during the period of time, the circuitry removes the voltage from the selected level which is sufficiently high to render the selected memory cell in the conductive state.

22. The non-volatile memory device of claim 19, wherein: the first and second plurality of memory cells are U-shaped.

23. The non-volatile memory device of claim 19, wherein: the circuitry is within the substrate.

24. The non-volatile memory device of claim 19, wherein: the circuitry is above the substrate.

25. The non-volatile memory device of claim 19, wherein: the at least one of the select gates of the second plurality of memory cells comprises a drain-side select gate of the second plurality of memory cells.

26. The non-volatile memory device of claim 19, wherein: the at least one of the select gates of the second plurality of memory cells comprises a source-side select gate of the second plurality of memory cells.

27. A method for performing a read operation, comprising: boosting a channel of an active area of a second plurality of memory cells, the second plurality of memory cells is formed above a substrate in multiple physical levels of memory cells in a three-dimensional non-volatile memory, a first plurality of memory cells is formed above the substrate in the multiple physical levels of memory cells in the three-dimensional non-volatile memory, the active area comprises a pillar which extends vertically in the three-dimensional non-volatile memory, the first plurality of memory cells comprises a selected memory cell in a selected level of the multiple physical levels, a drain-side select gate and a source-side select gate, and the second plurality of memory cells comprises a drain-side select gate and a source-side select gate, the boosting the channel comprises increasing a pass voltage for memory cells in unselected levels of the multiple physical levels from an initial level to an elevated level;

during the increasing of the pass voltage, before the pass voltage reaches the elevated level, interrupting the boosting by raising a voltage of the drain-side select gate of the second plurality of memory cells, causing the drain-side select gate of the second plurality of memory cells to transition from a non-conductive state to a conductive state; and with the channel at a boosted level caused by the boosting, and the pass voltage at the elevated level: applying a control gate read voltage to the selected memory cell and sensing whether a threshold voltage of the selected memory cell is above the control gate read voltage, the boosting of the channel of the active area, the interrupting of the boosting and the applying the control gate read voltage to the selected memory cell and sensing whether the threshold voltage of the selected memory cell is above the control gate read voltage, are performed by circuitry which is associated with operation of the first plurality of memory cells and the second plurality of memory cells.

28. The method of claim 27, further comprising: during the increasing of the pass voltage, transitioning the drain-side select gate of the second plurality of memory cells back from the conductive state to the non-conductive state.

* * * * *